US012725556B2

(12) United States Patent
Kim et al.

(10) Patent No.: US 12,725,556 B2
(45) Date of Patent: Sep. 1, 2026

(54) GATE DRIVER AND DISPLAY DEVICE INCLUDING THE GATE DRIVER, AND ELECTRONIC DEVICE INCLUDING THE DISPLAY DEVICE

(71) Applicant: Samsung Display Co., Ltd., Yongin-si (KR)

(72) Inventors: Hyunjoon Kim, Yongin-si (KR); Bon-Yong Koo, Yongin-si (KR); Junhyun Park, Yongin-si (KR); Jihoon Yang, Yongin-si (KR); Minjae Jeong, Yongin-si (KR); Junghwan Hwang, Yongin-si (KR); Jaeyong Jang, Yongin-si (KR); Dong-Hoon Lee, Yongin-si (KR); Jaehyung Cho, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 18/979,479

(22) Filed: Dec. 12, 2024

(65) Prior Publication Data

US 2025/0209960 A1 Jun. 26, 2025

(30) Foreign Application Priority Data

Dec. 22, 2023 (KR) ........................ 10-2023-0190505
Feb. 5, 2024 (KR) ........................ 10-2024-0017365

(51) Int. Cl.
*G09G 3/3266* (2016.01)
*G09G 3/20* (2006.01)
(Continued)

(52) U.S. Cl.
CPC ............ *G09G 3/2092* (2013.01); *G09G 3/32* (2013.01); *G09G 3/3266* (2013.01);
(Continued)

(58) Field of Classification Search
CPC ............ G09G 3/3266; G09G 2310/08; G09G 3/3677; G09G 2310/0267;
(Continued)

(56) References Cited

U.S. PATENT DOCUMENTS

| | | | | |
|---|---|---|---|---|
| 10,997,936 | B2 * | 5/2021 | Xu | G09G 3/20 |
| 11,610,530 | B2 | 3/2023 | Park et al. | |

(Continued)

FOREIGN PATENT DOCUMENTS

| | | | |
|---|---|---|---|
| CN | 114724613 | A | 7/2022 |
| KR | 20230099110 | A | 7/2023 |
| KR | 20240068866 | A | 5/2024 |

OTHER PUBLICATIONS

European Search Report; Application No. 24221438.5; mailed Mar. 14, 2025; 15 pages.

*Primary Examiner* — Dismery Mercedes
(74) *Attorney, Agent, or Firm* — CANTOR COLBURN LLP

(57) ABSTRACT

A gate driver includes stages including a delay circuit for receiving an input signal responsive to a clock signal and outputting the input signal to a control node, a voltage limiting circuit for limiting a voltage of the control node based on high and low limit voltages, an inverter circuit for inverting and outputting the voltage of the control node to an inverting control node, a carry output circuit for outputting a first low gate voltage to a carry output node and outputting a first high gate voltage to the carry output node responsive to the voltage of the inverting control node and a gate output circuit for outputting a second low gate voltage that is lower
(Continued)

than the first low gate voltage to a gate output node and outputting a second high gate voltage that is higher than the first high gate voltage to the gate output node.

24 Claims, 14 Drawing Sheets

(51) Int. Cl.
*G09G 3/32* (2016.01)
*G09G 3/36* (2006.01)
*G11C 19/28* (2006.01)

(52) U.S. Cl.
CPC ......... *G09G 3/3674* (2013.01); *G09G 3/3677* (2013.01); *G11C 19/28* (2013.01); *G09G 2300/0426* (2013.01); *G09G 2310/0267* (2013.01); *G09G 2310/0275* (2013.01); *G09G 2310/0286* (2013.01); *G09G 2310/08* (2013.01); *G09G 2330/021* (2013.01)

(58) Field of Classification Search
CPC ... G09G 2310/0275; G09G 2310/0286; G09G 3/2092; G09G 3/3696; G09G 2310/027; G09G 2300/0426; G09G 2330/021; G09G 3/32; G09G 2300/0819; G11C 19/287; G11C 19/28
See application file for complete search history.

(56) References Cited

U.S. PATENT DOCUMENTS

| | | | | |
|---|---|---|---|---|
| 12,322,313 | B2* | 6/2025 | Fan | G09G 3/3266 |
| 2006/0290390 | A1* | 12/2006 | Jang | G11C 19/28<br>327/112 |
| 2015/0356913 | A1 | 12/2015 | Kim | |
| 2017/0032731 | A1* | 2/2017 | Shim | G09G 3/3677 |
| 2017/0294165 | A1* | 10/2017 | Park | G09G 3/3266 |
| 2021/0335269 | A1* | 10/2021 | Yuan | G09G 3/3266 |
| 2021/0335317 | A1* | 10/2021 | Liu | G09G 3/3674 |
| 2022/0406248 | A1* | 12/2022 | Ju | G09G 3/3258 |
| 2023/0010792 | A1* | 1/2023 | Heo | G11C 19/28 |
| 2024/0265873 | A1* | 8/2024 | Chen | H10D 86/425 |
| 2024/0282246 | A1* | 8/2024 | Jang | H10D 86/441 |

* cited by examiner 10
140
GAMMA REFERENCE
VOLTAGE GENERATOR
VGREF
150
DATA DRIVER
110
GL
P
DL
CONT3
CONT2
DATA
CONT1
GATE
DRIVER
130
DRIVING
CONTROLLER
120
IMG
CONT

FIG. 3

|  | TYPE | VTH |
| --- | --- | --- |
| T2 | NMOS | 1V |
| T3 | PMOS | −2V |

800
850
GS
NGS
T8
T7
C2
C1
T4
VGH
VGL2
NQ2
NQB
T3
830
T2
VGL_P
(VGL1, VGL2)
820
NQ1
T6
NCR
T5
VGL1
840
CR
CLK
T1
810
FLM/PCR

| | TYPE | VTH |
|---|---|---|
| T2 | PMOS | -2V |

GATE DRIVER AND DISPLAY DEVICE INCLUDING THE GATE DRIVER, AND ELECTRONIC DEVICE INCLUDING THE DISPLAY DEVICE

This application claims priority to Korean Patent Application No. 10-2023-0190505, filed on Dec. 22, 2023, and Korean Patent Application No. 10-2024-0017365, filed on Feb. 5, 2024, and all the benefits accruing therefrom under 35 USC § 119, the contents of which in their entirety are herein incorporated by reference.

BACKGROUND

1. Field

The invention relates to a gate driver and a display device including the same, and more particularly to a gate driver, a display device including the gate driver, and an electronic device including the display device for reducing a dead space.

2. Description of the Related Art

In general, a display device includes a display panel and a display panel driver. The display panel includes gate lines, data lines, emission lines and pixels and the display panel driver includes a gate driver for providing gate signals to the gate lines, a data driver for providing data voltages to the data lines, and a driving controller for controlling the gate driver and the data driver.

The gate driver may sequentially provide the gate signals to the pixels PX of the display panel in a row-by-row unit. The gate driver may also include a plurality of stages to sequentially provide the gate signals in the row-by-row unit.

In general, each stage of the gate driver may include a single type of transistor, for example, a P-type metal oxide semiconductor (PMOS) transistor only. When each stage includes only the PMOS transistor, a bootstrapping operation is required to be performed to decrease a voltage of an internal node of each stage to a voltage level that is lower than a low voltage level in order to output a gate signal of the low voltage level.

In order to prevent the bootstrapping operation, each stage may include a complementary metal oxide semiconductor (CMOS) transistor.

When a portion of a carry output circuit of each stage and a portion of a gate output circuit of each stage are formed of an N-type metal oxide semiconductor (NMOS) transistor, a threshold voltage of the NMOS transistor may be shifted in a negative direction, thereby decreasing operational reliability of the carry output circuit and the gate output circuit. In addition, when the carry output circuit and the gate output circuit are formed of NMOS oxide transistors, the size of the NMOS oxide transistors may be increased due to a lack of mobility, thereby increasing a dead space of the gate driver.

SUMMARY

The invention provides a gate driver for reducing a dead space by forming a carry output circuit and a gate output circuit using PMOS transistors.

The invention provides a display device including the gate driver.

The invention provides an electronic device including the display device.

In an embodiment, the gate driver includes a plurality of stages, where each of the stages includes a delay circuit configured to receive an input signal in response to a clock signal and output the input signal to a control node, a voltage limiting circuit configured to limit a voltage of the control node based on a high limit voltage and a low limit voltage, an inverter circuit configured to invert the voltage of the control node to output the inverted voltage to an inverting control node, a carry output circuit configured to output a first low gate voltage to a carry output node in response to the voltage of the control node, and output a first high gate voltage to the carry output node in response to the voltage of the inverting control node, and a gate output circuit configured to output a second low gate voltage that is lower than the first low gate voltage to a gate output node in response to the voltage of the control node, and output a second high gate voltage that is higher than the first high gate voltage to the gate output node in response to the voltage of the inverting control node.

In an embodiment, a voltage swing width between the first high gate voltage and the first low gate voltage may be smaller than a voltage swing width between the second high gate voltage and the second low gate voltage.

In an embodiment, the delay circuit may include a first transistor including a gate electrode for receiving the clock signal, a first electrode for receiving the input signal, and a second electrode connected to the control node.

In an embodiment, the control nodes may include a first control node, a second control node and a third control node, and the voltage limiting circuit may include a second transistor including a gate electrode for receiving the high limit voltage, a first electrode connected to the first control node, and a second electrode connected to the second control node. The voltage limiting circuit may also include a third transistor including a gate electrode for receiving the low limit voltage, a first electrode connected to the second control node, and a second electrode connected to the third control node.

In an embodiment, the second transistor may be an NMOS transistor, and the third transistor may be a PMOS transistor.

In an embodiment, the control nodes may include a first control node, a second control node and a third control node, and the voltage limiting circuit may include a second transistor including a gate electrode for receiving the low limit voltage, a first electrode connected to the first control node, and a second electrode connected to the second control node, and a third transistor including a gate electrode for receiving the high limit voltage, a first electrode connected to the second control node, and a second electrode connected to the third control node.

In an embodiment, the second transistor may be a PMOS transistor, and the third transistor may be an NMOS transistor.

In an embodiment, the high limit voltage may be different from the first high gate voltage and the second high gate voltage, and the low limit voltage may be different from the first low gate voltage and the second low gate voltage.

In an embodiment, the high limit voltage may be equal to the first high gate voltage, and the low limit voltage may be equal to the first low gate voltage.

In an embodiment, the high limit voltage may be equal to the first high gate voltage, and the low limit voltage may be equal to the second low gate voltage.

In an embodiment, the high limit voltage may be equal to the second high gate voltage, and the low limit voltage may be equal to the first low gate voltage.

In an embodiment, the high limit voltage may be equal to the second high gate voltage, and the low limit voltage may be equal to the second low gate voltage.

In an embodiment, the inverter circuit may include a fourth transistor including a gate electrode connected to the control node, a first electrode configured to receive the second low gate voltage, and a second electrode connected to the inverting control node, and a fifth transistor including a gate electrode connected to the control node, a first electrode configured to receive the second high gate voltage, and a second electrode connected to the inverting control node.

In an embodiment, the fourth transistor may be an NMOS transistor, and the fifth transistor may be a PMOS transistor.

In an embodiment, the carry output circuit may include a sixth transistor including a gate electrode connected to the control node, a first electrode configured to receive the first low gate voltage, and a second electrode connected to the carry output node, and a seventh transistor including a gate electrode connected to the inverting control node, a first electrode configured to receive the first high gate voltage, and a second electrode connected to the carry output node.

In an embodiment, the gate output circuit may include an eighth transistor including a gate electrode connected to the control node, a first electrode configured to receive the second low gate voltage, and a second electrode connected to the gate output node, and a ninth transistor including a gate electrode connected to the inverting control node, a first electrode configured to receive the second high gate voltage, and a second electrode connected to the gate output node.

In an embodiment, the gate output circuit may further include a first capacitor including a first electrode connected to the control node and a second electrode connected to the gate output node, and a second capacitor including a first electrode configured to receive the second high gate voltage and a second electrode connected to the inverting control node.

In an embodiment, the gate driver includes a plurality of stages, where each of the stages includes a delay circuit configured to receive an input signal in response to a clock signal and output the input signal to a control node, a voltage limiting circuit configured to limit a voltage of the control node based on a low limit voltage, an inverter circuit configured to invert the voltage of the control node to output the inverted voltage to an inverting control node, a carry output circuit configured to output a first low gate voltage to a carry output node in response to the voltage of the control node, and output a high gate voltage to the carry output node in response to a voltage of the inverting control node, and a gate output circuit configured to output a second low gate voltage that is lower than the first low gate voltage to a gate output node in response to the voltage of the control node, and output the high gate voltage to the gate output node in response to the voltage of the inverting control node. The control nodes include a first control node and a second control node. The voltage limiting circuit includes a second transistor including a gate electrode for receiving the low limit voltage, a first electrode connected to the first control node, and a second electrode connected to the second control node. The inverter circuit includes a third transistor including a gate electrode connected to the second control node, a first electrode configured to receive the second low gate voltage, and a second electrode connected to the inverting control node, and a fourth transistor including a gate electrode connected to the first control node, a first electrode configured to receive the high gate voltage, and a second electrode connected to the inverting control node.

In an embodiment, a voltage swing width between the high gate voltage and the first low gate voltage may be smaller than a voltage swing width between the high gate voltage and the second low gate voltage.

In an embodiment, the low limit voltage may be equal to the first low gate voltage.

In an embodiment, the low limit voltage may be equal to the second low gate voltage.

In an embodiment, the second transistor may be a PMOS transistor.

In an embodiment, the display device includes a display panel including a plurality of pixels and a gate driver configured to provide a gate signal to the plurality of pixels. The gate driver includes a plurality of stages, where each of the stages includes a delay circuit configured to receive an input signal having a voltage swing width between a first high gate voltage and a first low gate voltage in response to a clock signal, and outputs the input signal to a control node, a voltage limiting circuit configured to limit a voltage of the control node based on a high limit voltage and a low limit voltage, an inverter circuit configured to invert the voltage of the control node and output the inverted voltage of the control node to an inverting control node, a carry output circuit configured to output a carry signal to a carry output node in response to the voltage of the control node, and a gate output circuit configured to output a second low gate voltage that is lower than the first low gate voltage to a gate output node in response to the voltage of the control node, and output a second high gate voltage that is higher than the first high gate voltage to the gate output node in response to the voltage of the inverting control node.

In an embodiment, the voltage swing width between the first high gate voltage and the first low gate voltage may be smaller than a voltage swing width between the second high gate voltage and the second low gate voltage.

In an embodiment, the control nodes may include a first control node, a second control node and a third control node, and the voltage limiting circuit may include a second transistor including a gate electrode configured to receive the high limit voltage, a first electrode connected to the first control node, and a second electrode connected to the second control node and a third transistor including a gate electrode configured to receive the low limit voltage, a first electrode connected to the second control node, and a second electrode connected to the third control node.

In an embodiment, the electronic device includes a display panel including a plurality of pixels, a gate driver configured to provide a gate signal to the plurality of pixels, a data driver configured to provide a data voltage to the plurality of pixels, a driving controller configured to control the gate driver and the data driver, and a processor configured to control the driving controller. The gate driver includes a plurality of stages, where each of the stages includes a delay circuit configured to receive an input signal having a voltage swing width between a first high gate voltage and a first low gate voltage in response to a clock signal, and outputs the input signal to a control node, a voltage limiting circuit configured to limit a voltage of the control node based on a high limit voltage and a low limit voltage, an inverter circuit configured to invert the voltage of the control node and output the inverted voltage of the control node to an inverting control node, a carry output circuit configured to output a carry signal to a carry output node in response to the voltage of the control node, and a gate output circuit configured to output a second low gate voltage that is lower than the first low gate voltage to a gate output node in response to the voltage of the control node, and output a second high gate voltage that is higher than the first high gate voltage to the gate output node in response to the voltage of the inverting control node.

In an embodiment and according to the gate driver, the display device including the gate driver, and the electronic device including the display device, the carry output circuit and the gate output circuit may be formed of the PMOS transistor having high reliability and high mobility, so that the reliability of the gate driver may be improved, and the dead space of the gate driver may be reduced.

In an embodiment, since the voltage of the third control node may be bootstrapped and the sixth transistor and accordingly the eighth transistor may be sufficiently turned on or turned off, the reliability of the gate driver may be improved.

In an embodiment, the bootstrapped voltage of the third control node may be maintained by the voltage limiting circuit, so that the reliability of the gate driver may be improved.

In an embodiment, the gate output circuit may output the second high gate voltage and the second low gate voltage, so that the performance of the gate driver may be improved.

In an embodiment, since the voltage swing width between the first high gate voltage and the first low gate voltage received by the carry output circuit may be smaller than the voltage swing width between the second high gate voltage and the second low gate voltage received by the gate output circuit, the power consumption of the gate driver may be decreased.

BRIEF DESCRIPTION OF THE DRAWINGS

The above and other features of the present invention will become more apparent by describing in detailed embodiments thereof with reference to the accompanying drawings, in which:

FIG. 3 is a schematic circuit diagram showing an example of the stage included in the gate driver of FIG. 2, according to an embodiment;

FIG. 6 is a schematic circuit diagram showing an example of the stage included in the gate driver of FIG. 2, according to an embodiment;

FIG. 7 is a schematic circuit diagram which illustrates the case in which the gate electrode of the second transistor receives the high limit voltage equal to the first high gate voltage and the gate electrode of the third transistor receives the low limit voltage equal to the second low gate voltage, according to an embodiment;

FIG. 8 is a schematic circuit diagram showing another example of the stage included in the gate driver of FIG. 2, according to an embodiment;

FIG. 10 is a schematic circuit diagram showing an example of the stage included in the gate driver of FIG. 2, according to an embodiment;

FIG. 11 is a schematic circuit diagram showing another example of the stage included in the gate driver of FIG. 2, according to an embodiment;

DETAILED DESCRIPTION

Figure 1:
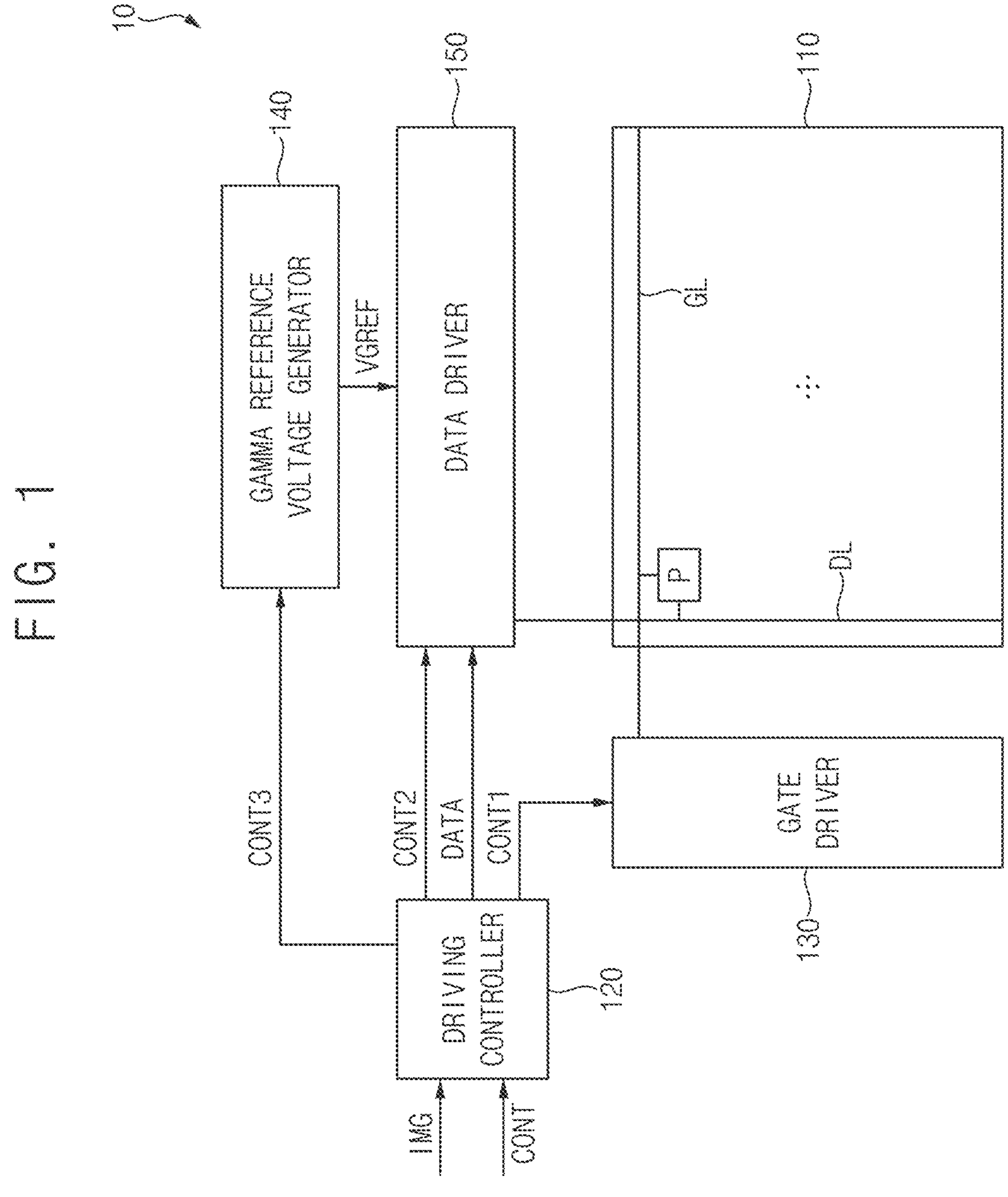
FIG. 1 is a schematic block diagram showing a display device, according to an embodiment.

Hereinafter, the invention will be described in more detail with reference to the accompanying drawings. The same reference numerals are used for the same components in the drawings, and redundant descriptions of the same components will be omitted.

It will be understood that when an element (or a region, a layer, a portion, or the like) is referred to as being related to another such as being "on", "connected to" or "coupled to" another element, it may be directly disposed on, connected or coupled to the other element, or intervening elements may be disposed therebetween.

Like reference numerals or symbols refer to like elements throughout. In the drawings, the thickness, the ratio, and the size of the element are exaggerated for effective description of the technical contents. As used herein, the term "and/or" includes any and all combinations of one or more of the associated listed items.

The term "and/or," may include all combinations of one or more of which associated configurations may define.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the scope of the inventive concept. Similarly, a second element, component, region, layer or section may be termed a first element, component, region, layer or section. As used herein, the singular forms, "a", "an" and "the" are intended to include the plural forms as well, unless the context clearly indicates otherwise.

Also, terms of "below", "on lower side", "above", "on upper side", or the like may be used to describe the relationships of the elements illustrated in the drawings. These terms have relative concepts and are described on the basis of the directions indicated in the drawings.

It will be further understood that the terms "comprise", "includes" and/or "have", when used in this specification, specify the presence of stated features, integers, steps, operations, elements, components, and/or groups thereof, but do not preclude the presence or addition of one or more other features, integers, steps, operations, elements, components, and/or groups thereof. As used herein, being "disposed directly on" may mean that there is no additional layer, film, region, plate, or the like between a part and another part such as a layer, a film, a region, a plate, or the like. For example, being "disposed directly on" may mean that two layers or two members are disposed without using an additional member such as an adhesive member, therebetween.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within +30%, 20%, 10% or 5% of the stated value.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a schematic block diagram showing a display device 10, according to an embodiments.

In an embodiment and referring to FIG. 1, a display device 10 may include a display panel 110 and a display panel driver. The display panel driver may include a driving controller 120, a gate driver 130, a gamma reference voltage generator 140, and a data driver 150.

The display panel 110 may include a display area for displaying an image and a peripheral area disposed adjacent to the display area.

The display panel 110 may include gate lines GL, data lines DL, pixels P electrically connected to the gate lines GL and the data lines DL. The gate lines GL may extend in a first direction, and the data lines DL may extend in a second direction crossing the first direction.

The driving controller 120 may receive input image data IMG and an input control signal CONT from an external device (not shown). For example, the input image data IMG may include red image data, green image data and blue image data. In other embodiments, the input image data IMG may include white image data and/or the input image data IMG may include magenta image data, yellow image data, and cyan image data. The input control signal CONT may include a master clock signal and a data enable signal. The input control signal CONT may further include a vertical synchronization signal and a horizontal synchronization signal.

The driving controller 120 may generate a first control signal CONT1, a second control signal CONT2, a third control signal CONT3, and a data signal DATA based on the input image data IMG and the input control signal CONT.

The driving controller 120 may generate the first control signal CONT1 for controlling an operation of the gate driver 130 based on the input control signal CONT, and output the first control signal CONT1 to the gate driver 130. The first control signal CONT1 may include a vertical start signal and a gate clock signal.

The driving controller 120 may generate the second control signal CONT2 for controlling an operation of the data driver 150 based on the input control signal CONT, and output the second control signal CONT2 to the data driver 150. The second control signal CONT2 may include a horizontal start signal and a load signal.

The driving controller 120 may generate the data signal DATA based on the input image data IMG. The driving controller 120 may output the data signal DATA to the data driver 150.

The driving controller 120 may generate the third control signal CONT3 for controlling an operation of the gamma reference voltage generator 140 based on the input control signal CONT, and output the third control signal CONT3 to the gamma reference voltage generator 140.

The gate driver 130 may generate gate signals for driving the gate lines GL in response to the first control signal CONT1 received from the driving controller 120 and may output the gate signals to the gate lines GL.

The gamma reference voltage generator 140 may generate a gamma reference voltage VGREF in response to the third control signal CONT3 received from the driving controller 120 and may provide the gamma reference voltage VGREF to the data driver 150. The gamma reference voltage VGREF may have a value corresponding to each data signal DATA.

In an embodiment, the gamma reference voltage generator 140 may be disposed in the driving controller 120 or may be disposed in the data driver 150.

The data driver 150 may receive the second control signal CONT2 and the data signal DATA from the driving controller 120 and receive the gamma reference voltage VGREF from the gamma reference voltage generator 140. The data driver 150 may convert the data signal DATA into a data voltage having an analog type using the gamma reference voltage VGREF. The data driver 150 may output the data voltage to the data line DL.

Figure 2:
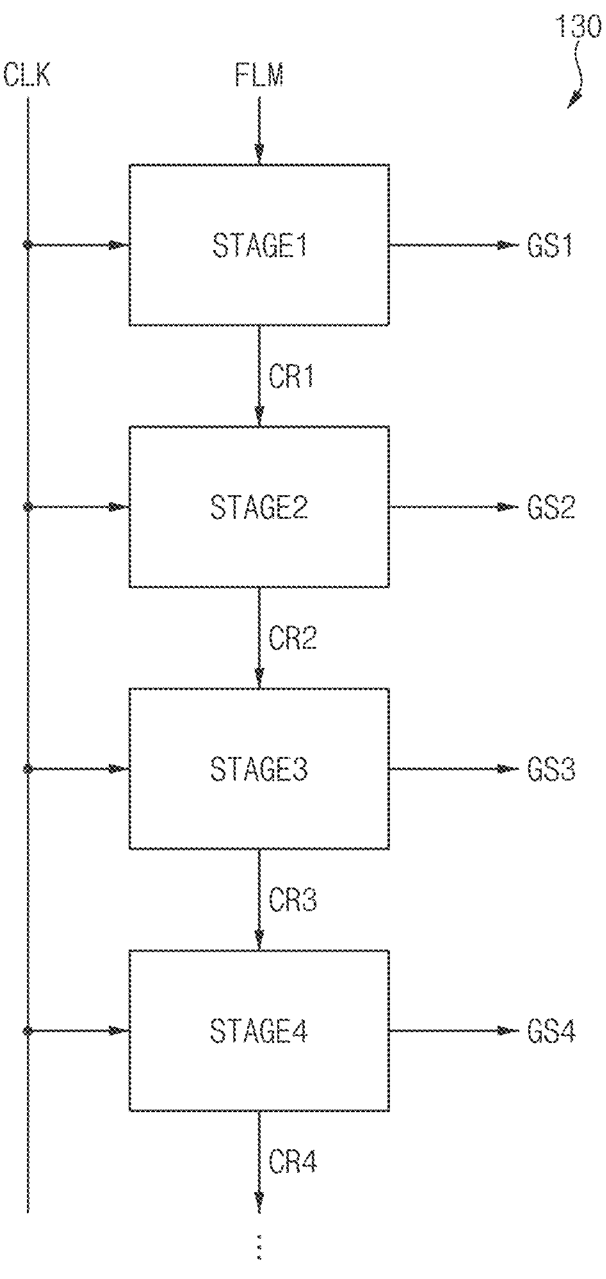
FIG. 2 is a block diagram showing a gate driver included in a display device of FIG. 1, according to an embodiment.

FIG. 2 is a block diagram showing a gate driver 130 included in a display device 10 of FIG. 1, according to an embodiment.

In an embodiment and referring to FIGS. 1 and 2, the gate driver 130 may include a plurality of stages STAGE1, STAGE2, STAGE3, STAGE4, . . . which receive a gate start signal FLM and a clock signal CLK and output gate signals GS1, GS2, GS3, GS4, . . . , respectively. The first stage STAGE1 may receive the gate start signal FLM as an input signal, and subsequent stages STAGE2, STAGE3, STAGE4, . . . may receive carry signals CR1, CR2, CR3, CR4, . . . of the respective previous stages, as the input signal.

The stages STAGE1, STAGE2, STAGE3, STAGE4, . . . may sequentially output the carry signals CR1, CR2, CR3, CR4, . . . , respectively, and the gate signals GS1, GS2, GS3, GS4, . . . , respectively. For example, the first stage STAGE1 may output the first carry signal CR1 and the first gate signal GS1 based on the gate start signal FLM, the second stage STAGE2 may output the second carry signal CR2 and the second gate signal GS2 based on the first carry signal CR1, the third stage STAGE3 may output the third carry signal CR3 and the third gate signal GS3 based on the second carry signal CR2, and the fourth stage STAGE4 may output the fourth carry signal CR4 and the fourth gate signal GS4 based on the third carry signal CR3.

Figure 3:
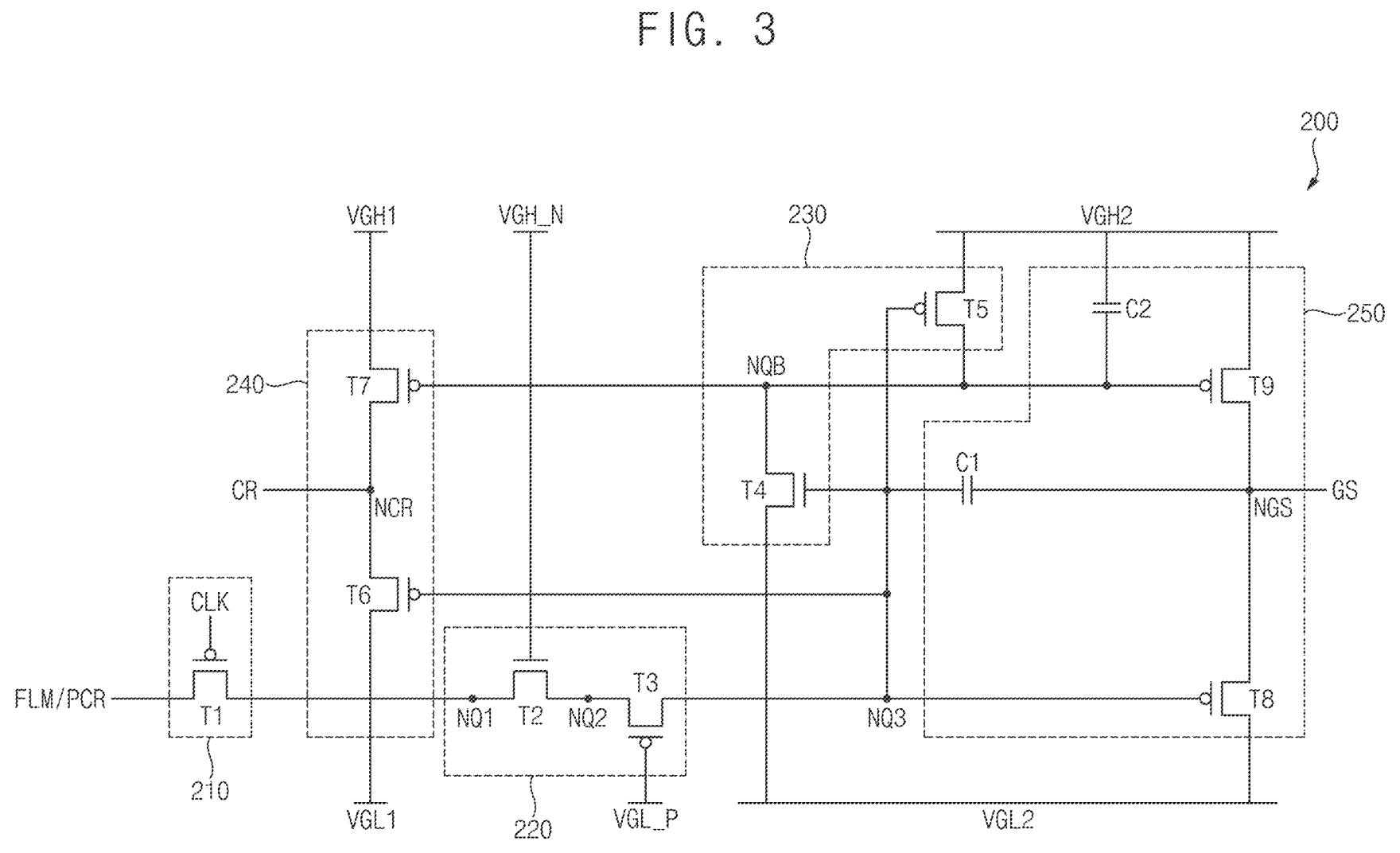

FIG. 3 is a circuit diagram showing an example of the stage 200 included in the gate driver 130 of FIG. 2, according to an embodiment.

In an embodiment and referring to FIGS. 1 to 3, the gate driver 130 may include a plurality of stages 200. Each stage 200 may include a delay circuit 210, a voltage limiting circuit 220, an inverter circuit 230, a carry output circuit 240, and a gate output circuit 250.

The delay circuit 210 may receive an input signal FLM/PCR in response to the clock signal CLK and output the input signal FLM/PCR to control nodes NQ1, NQ2 and NQ3.

In an embodiment, the delay circuit 210 may include a first transistor T1, where the first transistor T1 may include a gate electrode for receiving the clock signal CLK, a first electrode for receiving the input signal FLM/PCR, and a second electrode connected to the control nodes NQ1, NQ2 and NQ3. The first transistor T1 may be a PMOS transistor.

The voltage limiting circuit 220 may limit voltages of the control nodes NQ1, NQ2 and NQ3 based on a high limit voltage VGH_N and a low limit voltage VGL_P.

In an embodiment, the voltage limiting circuit 220 may include a second transistor T2 and a third transistor T3. The second transistor T2 may include a gate electrode for receiving the high limit voltage VGH_N, a first electrode connected to the first control node NQ1, and a second electrode connected to the second control node NQ2. The third transistor T3 may include a gate electrode for receiving the low limit voltage VGL_P, a first electrode connected to the second control node NQ2, and a second electrode connected to the third control node NQ3. The second transistor T2 may be an NMOS transistor, and the third transistor T3 may be a PMOS transistor.

The inverter circuit 230 may invert the voltages of the control nodes NQ1, NQ2 and NQ3 and output the inverted voltages to an inverting control node NQB.

In an embodiment, the inverter circuit 230 may include a fourth transistor T4 and a fifth transistor T5. The fourth transistor T4 may include a gate electrode connected to the control nodes NQ1, NQ2 and NQ3, a first electrode for receiving a second low gate voltage VGL2, and a second electrode connected to the inverting control node NQB. The fifth transistor T5 may include a gate electrode connected to the control nodes NQ1, NQ2 and NQ3, a first electrode for receiving a second high gate voltage VGH2, and a second electrode connected to the inverting control node NQB. The fourth transistor T4 may be the NMOS transistor, and the fifth transistor T5 may be the PMOS transistor.

The carry output circuit 240 may output a carry signal CR. The carry output circuit 240 may output a first low gate voltage VGL1 to a carry output node NCR in response to the voltages of the control nodes NQ1, NQ2 and NQ3, and may output a first high gate voltage VGH1 to the carry output node NCR in response to a voltage of the inverting control node NQB.

In an embodiment, the carry output circuit 240 may include a sixth transistor T6 and a seventh transistor T7. The sixth transistor T6 may include a gate electrode connected to the control nodes NQ1, NQ2 and NQ3, a first electrode for receiving the first low gate voltage VGL1, and a second electrode connected to the carry output node NCR. The seventh transistor T7 may include a gate electrode connected to the inverting control node NQB, a first electrode for receiving the first high gate voltage VGH1, and a second electrode connected to the carry output node NCR. The sixth transistor T6 and the seventh transistor T7 may be the PMOS transistor.

The gate output circuit 250 may output a gate signal GS. The gate output circuit 250 may output the second low gate voltage VGL2 which is a lower voltage than the first low gate voltage VGL1 to a gate output node NGS in response to the voltages of the control nodes NQ1, NQ2 and NQ3, and may output the second high gate voltage VGH2 which is a voltage that is higher than the first high gate voltage VGH1 to the gate output node NGS in response to the voltage of the inverting control node NQB.

In an embodiment, the gate output circuit 250 may include an eighth transistor T8 and a ninth transistor T9. The eighth transistor T8 may include a gate electrode connected to the control nodes NQ1, NQ2 and NQ3, a first electrode for receiving the second low gate voltage VGL2, and a second electrode connected to the gate output node NGS. The ninth transistor T9 may include a gate electrode connected to the inverting control node NQB, a first electrode for receiving the second high gate voltage VGH2, and a second electrode connected to the gate output node NGS. The eighth transistor T8 and the ninth transistor T9 may be the PMOS transistor.

In an embodiment, the gate output circuit 250 may further include a first capacitor C1 and a second capacitor C2. The first capacitor C1 may include a first electrode connected to the control nodes NQ1, NQ2 and NQ3 and a second electrode connected to the gate output node NGS. The second capacitor C2 may include a first electrode for receiving the second high gate voltage VGH2 and a second electrode connected to the inverting control node NQB.

In an embodiment, since the sixth transistor T6 of the carry output circuit 240 and the eighth transistor T8 of the gate output circuit 250 are the PMOS transistors other than NMOS transistors, a negative shift in threshold voltages of the sixth transistor T6 and the eighth transistor T8 may be prevented, and a dead space of the gate driver 130, which is increased by enlarging the sizes of the sixth transistor T6 and the eighth transistor T8 to compensate for mobility of the sixth transistor T6 and the eighth transistor T8, may be prevented from being increased.

Accordingly, since each stage 200 includes nine transistors and two capacitors, the area occupied by each stage 200 may be decreased and the data space of the gate driver 130 may be decreased.

Figure 4:
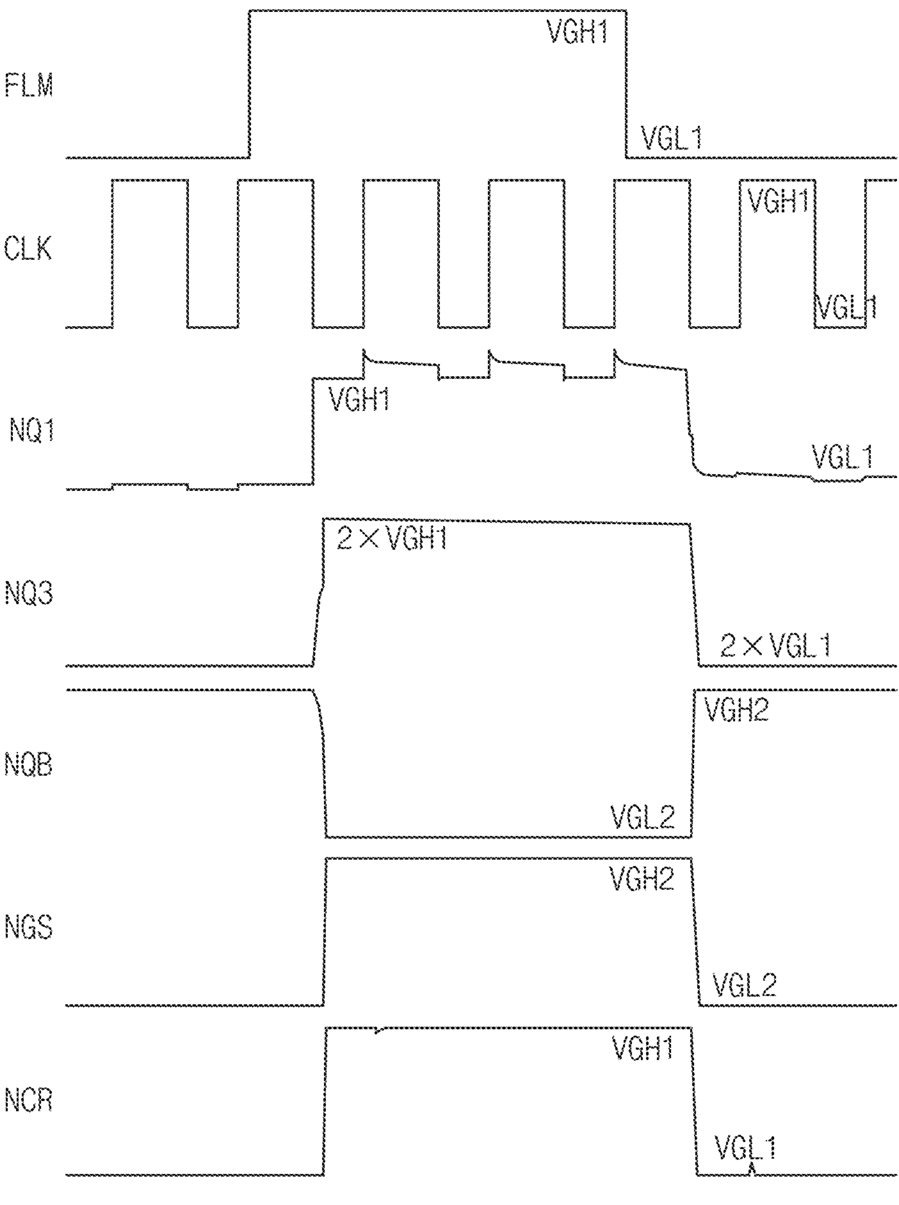
FIG. 4 is a timing diagram showing an example of the operation of the stage of FIG. 3, according to an embodiment.
Figure 5:
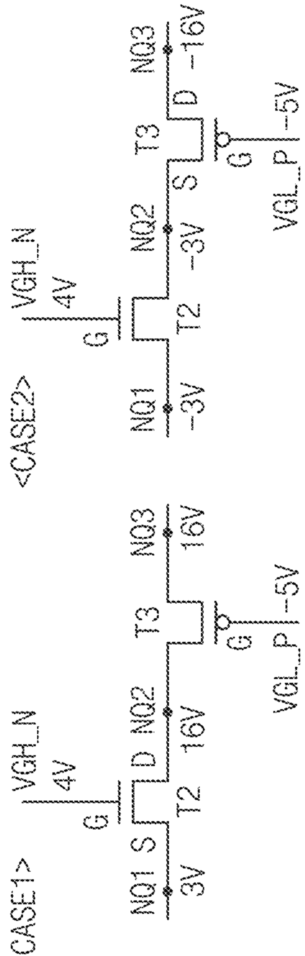
FIG. 5 is a schematic circuit diagram showing an example of the operation of the voltage limiting circuit included in the stage of FIG. 3, according to an embodiment.

FIG. 4 is a timing diagram showing an example of the operation of the stage 200 of FIG. 3, according to an embodiment. FIG. 5 is a circuit diagram showing an example of the operation of the voltage limiting circuit 220 included in the stage 200 of FIG. 3, according to an embodiment.

In an embodiment and referring to FIGS. 1 to 5, the control nodes NQ1, NQ2 and NQ3 may include the first control node NQ1, the second control node NQ2, and the third control node NQ3.

In an embodiment, the delay circuit 210 may receive the input signal FLM/PCR in response to the clock signal CLK, and output the input signal FLM/PCR to the control nodes NQ1, NQ2 and NQ3. Specifically, the first transistor T1 may receive the input signal FLM/PCR in response to the clock signal CLK having the first low gate voltage VGL1 and output the input signal FLM/PCR to the first control node NQ1. Therefore, the input signal FLM/PCR may be delayed by one horizontal period by the delay circuit 210 and output to the first control node NQ1.

For example, when the clock signal CLK has the first low gate voltage VGL1, the first transistor T1 may receive the input signal FLM/PCR having the first high gate voltage VGH1 in response to the clock signal CLK having the first low gate voltage VGL1 and may output the input signal FLM/PCR having the first high gate voltage VGH1 to the first control node NQ1. The first control node NQ1 may have the first high gate voltage VGH1.

The voltage limiting circuit 220 may output the voltage of the first control node NQ1 to the third control node NQ3.

Specifically, the second transistor T2 may output the voltage of the first control node NQ1 to the second control node NQ2, and the third transistor T3 may output the voltage of the second control node NQ2 to the third control node NQ3.

For example, when the first control node NQ1 has the first high gate voltage VGH1, the second transistor T2 may output the voltage of the first control node NQ1 to the second control node NQ2, and the third transistor T3 may output the voltage of the second control node NQ2 to the third control node NQ3. The third control node NQ3 may have the first high gate voltage VGH1.

The inverter circuit 230 may invert the voltages of the control nodes NQ1, NQ2 and NQ3 to output the inverted voltages to the inverting control node NQB. Specifically, when the third control node NQ3 has a high level, the fourth transistor T4 may output the second low gate voltage VGL2 to the inverting control node NQB in response to the third control node NQ3 having the high level. In addition, when the third control node NQ3 has a low level, the fifth transistor T5 may output the second high gate voltage VGH2 to the inverting control node NQB in response to the third control node NQ3 having the low level. Therefore, the inverting control node NQB may have a phase inverted with the voltage of the third control node NQ3 by the inverter circuit 230.

In an embodiment, when the third control node NQ3 has the first high gate voltage VGH1, the fourth transistor T4 may output the second low gate voltage VGL2 to the inverting control node NQB in response to the third control node NQ3 having the first high gate voltage VGH1. The inverting control node NQB may then have the second low gate voltage VGL2.

In an embodiment, the carry output circuit 240 may output a carry signal CR. The carry output circuit 240 may output a first low gate voltage VGL1 to the carry output node NCR in response to the voltages of the control nodes NQ1, NQ2 and NQ3, and may output a first high gate voltage VGH1 to the carry output node NCR in response to a voltage of the inverting control node NQB. Specifically, when the inverting control node NQB has the low level, the seventh transistor T7 may output the first high gate voltage VGH1 to the carry output node NCR in response to the inverting control node NQB having the low level. In addition, when the third control node NQ3 has the low level, the sixth transistor T6 may output the first low gate voltage VGL1 to the carry output node NCR in response to the third control node NQ3 having the low level.

For example, when the inverting control node NQB has the second low gate voltage VGL2, the seventh transistor T7 may output the first high gate voltage VGH1 to the carry output node NCR in response to the inverting control node NQB having the second low gate voltage VGL2. The carry output node NCR may then have the first high gate voltage VGH1.

In an embodiment, the gate output circuit 250 may output a gate signal GS. The gate output circuit 250 may output the second low gate voltage VGL2 to the gate output node NGS in response to the voltages of the control nodes NQ1, NQ2 and NQ3, and may output the second high gate voltage VGH2 to the gate output node NGS in response to the voltage of the inverting control node NQB. Specifically, when the inverting control node NQB has the low level, the ninth transistor T9 may output the second high gate voltage VGH2 to the gate output node NGS in response to the inverting control node NQB having the low level. In addition, when the third control node NQ3 has the low level, the eighth transistor T8 may output the second low gate voltage VGL2 to the gate output node NGS in response to the third control node NQ3 having the low level.

For example, when the inverting control node NQB has the second low gate voltage VGL2, the ninth transistor T9 may output the second high gate voltage VGH2 to the gate output node NGS in response to the inverting control node NQB having the second low gate voltage VGL2. The gate output node NGS may then have the second high gate voltage VGH2.

In an embodiment, while the voltage of the third control node NQ3 (i.e., the first electrode of the first capacitor C1) is twice the first low gate voltage VGL1 and the voltage of the gate output node NGS (i.e. the second electrode of the first capacitor C1) is the second low gate voltage VGL2, the voltage stored between the electrodes of the first capacitor C1 may be given by "2×VGL1−VGL2".

In an embodiment, when the voltage of the gate output node NGS is changed, the voltage of the third control node NQ3 may be bootstrapped while the stored voltage is maintained between the two electrodes of the first capacitor C1. When the voltage of the gate output node NGS is increased by "VGH2−VGL2" from the second low gate voltage VGL2 to the second high gate voltage VGH2, the voltage of the third control node NQ3 may be increased by "VGH2−VGL2" from the first low gate voltage VGL1, and the voltage of the third control node NQ3 may be bootstrapped to a voltage of "2×VGL1+(VGH2−VGL2)". In this way, when the voltage of the gate output node NGS is increased to the second high gate voltage VGH2, the voltage of the third control node NQ3 may be bootstrapped to a voltage higher than the first high gate voltage VGH1 by the first capacitor C1. For example, the bootstrapped voltage (i.e., "2×VGL1+(VGH2−VGL2)") of the third control node NQ3 may be approximately twice the first high gate voltage VGH1. In this embodiment, the approximately twice the first high gate voltage VGH1 may be higher than the second high gate voltage VGH2. Since the bootstrapped voltage of the third control node NQ3 is the voltage higher than the second high gate voltage VGH2, the sixth transistor T6 and the eighth transistor T8 may be sufficiently turned off, and the reliability of operations of the sixth transistor T6 and the eighth transistor T8 may be improved.

In an embodiment, the voltage limiting circuit 220 may limit the voltages of the control nodes NQ1, NQ2 and NQ3 based on the high limit voltage VGH_N and the low limit voltage VGL_P. Specifically, the voltage limiting circuit 220 may limit a voltage flow through which the bootstrapped voltage of the third control node NQ3 is transmitted to the first control node NQ1, and the bootstrapped voltage of the third control node NQ3 may be maintained. The reliability of the operations of the sixth transistor T6 and the eighth transistor T8 may be further improved.

In an embodiment and as shown in FIG. 5, a threshold voltage of the second transistor T2 may be 1V, a threshold voltage of the third transistor T3 may be −2V, the high limit voltage VGH_N may be 4V, and the low limit voltage VGL_P may be −5V. However, the voltages shown in FIG. 5 are set to describe the operation of the voltage limiting circuit 220 and are not directly related to each stage 200 of FIGS. 3 and 4.

The embodiment of FIG. 5 denotes a first case in which the bootstrapped voltage of the third control node NQ3 is the high level. When the bootstrapped voltage of the third control node NQ3 is 16V, a gate-source voltage of the third transistor T3 may be −21V. Since the gate-source voltage of the third transistor T3 is lower than the threshold voltage of the third transistor T3, the third transistor T3 may be turned on, and may transmit the voltage of the third control node NQ3 to the second control node NQ2. When the voltage of the first control node NQ1 is 3V and the voltage of the second control node NQ2 is 16V, a gate-source voltage of the second transistor T2 may be 1V. Since a gate-source voltage of the first transistor T1 is not higher than the threshold voltage of the first transistor T1, the first transistor T1 may be turned off, and may not transmit the voltage of the second control node NQ2 to the first control node NQ1. Therefore, the bootstrapped voltage of the third control node NQ3 may be maintained at 16V.

In contrast, after the first high gate voltage VGH1 is output to the carry output node NCR and the second high gate voltage VGH2 is output to the gate output node NGS, the first transistor T1 may receive the input signal FLM/PCR having the first low gate voltage VGL1 in response to the clock signal CLK having the first low gate voltage VGL1, and may output the input signal FLM/PCR having the first low gate voltage VGL1 to the first control node NQ1. The first control node NQ1 may have the first low gate voltage VGL1.

When the first control node NQ1 has the first low gate voltage VGL1, the second transistor T2 may output the voltage of the first control node NQ1 to the second control node NQ2, and the third transistor T3 may output the voltage of the second control node NQ2 to the third control node NQ3. The third control node NQ3 may have the first low gate voltage VGL1.

When the third control node NQ3 has the first low gate voltage VGL1, the fifth transistor T5 may output the second high gate voltage VGH2 to the inverting control node NQB in response to the third control node NQ3 having the first low gate voltage VGL1. The inverting control node NQB may have the second high gate voltage VGH2.

When the third control node NQ3 has the first low gate voltage VGL1, the sixth transistor T6 may output the first low gate voltage VGL1 to the carry output node NCR in response to the third control node NQ3 having the first low gate voltage VGL1. The carry output node NCR may have the first low gate voltage VGL1.

When the third control node NQ3 has the first low gate voltage VGL1, the eighth transistor T8 may output the second low gate voltage VGL2 to the gate output node NGS in response to the third control node NQ3 having the first low gate voltage VGL1. The gate output node NGS may have the second low gate voltage VGL2.

While the voltage of the third control node NQ3 (i.e., the first electrode of the first capacitor C1) is twice the first high gate voltage VGH1 and the voltage of the gate output node NGS (i.e. the second electrode of the first capacitor C1) is the second high gate voltage VGH2, the voltage stored between the electrodes of the first capacitor C1 may be given by "2×VGH1−VGH2".

In an embodiment, when the voltage of the gate output node NGS is changed, the voltage of the third control node NQ3 may be bootstrapped while the stored voltage is maintained between the two electrodes of the first capacitor C1. When the voltage of the gate output node NGS is decreased by "VGH2−VGL2" from the second high gate voltage VGH2 to the second low gate voltage VGL2, the voltage of the third control node NQ3 may be decreased by "VGH2−VGL2" from the first high gate voltage VGH1, and the voltage of the third control node NQ3 may be bootstrapped to a voltage of "2×VGH1−(VGH2−VGL2)". In this way, when the voltage of the gate output node NGS is decreased to the second low gate voltage VGL2, the voltage of the third control node NQ3 may be bootstrapped to a voltage lower than the first low gate voltage VGL1 by the first capacitor C1. For example, the bootstrapped voltage (i.e., "2×VGH1−(VGH2−VGL2)") of the third control node NQ3 may be approximately twice the first low gate voltage VGL1. In this case, the approximately twice the first low gate voltage VGL1 may be lower than the second low gate voltage VGL2. Since the bootstrapped voltage of the third control node NQ3 is lower than the second low gate voltage VGL2, the sixth transistor T6 and the eighth transistor T8 may be sufficiently turned on, and the reliability of the operations of the sixth transistor T6 and the eighth transistor T8 may be improved.

In an embodiment and as shown in FIG. 5, the threshold voltage of the second transistor T2 may be 1V, the threshold voltage of the third transistor T3 may be −2V, the high limit voltage VGH_N may be 4V, and the low limit voltage VGL_P may be −5V.

The embodiment of FIG. 5 denotes a second case in which the bootstrapped voltage of the third control node NQ3 is the low level. When the voltage of the first control node NQ1 is −3V, the gate-source voltage of the second transistor T2 may be 7V. Since the gate-source voltage of the second transistor T2 is greater than the threshold voltage of the third transistor T3, the second transistor T2 may be turned on and transmit the voltage of the first control node NQ1 to the second control node NQ2. When the voltage of the second control node NQ2 is −3V and the bootstrapped voltage of the third control node NQ3 is −16V, the gate-source voltage of the third transistor T3 may be −2V. Since the gate-source voltage of the third transistor T3 is not lower than the threshold voltage of the third transistor T3, the third transistor T3 may be turned off and may not transmit the bootstrapped voltage of the third control node NQ3 to the second control node NQ2. Therefore, the bootstrapped voltage of the third control node NQ3 may be maintained at −16V. The reliability of the operations of the sixth transistor T6 and the eighth transistor T8 may be further improved.

In an embodiment, since the gate output circuit 250 outputs the second high gate voltage VGH2 and the second low gate voltage VGL2, the performance of the gate driver 130 may be improved. In addition, since a voltage swing width between the first high gate voltage VGH1 and the first low gate voltage VGL1 received by the carry output circuit 240 is smaller than a voltage swing width between the second high gate voltage VGH2 and the second low gate voltage VGL2 received by the gate output circuit 250, the power consumption of the gate driver 130 may be decreased. Since the voltage swing width between the first high gate voltage VGH1 and the first low gate voltage VGL1 of the input signal FLM/PCR is smaller than the voltage swing width between the second high gate voltage VGH2 and the second low gate voltage VGL2 received by the gate output circuit 250, the power consumption of the gate driver 130 may be decreased.

Accordingly, the carry output circuit 240 and the gate output circuit 250 are formed of the PMOS transistor having high reliability and high mobility, so that the reliability of the gate driver 130 may be improved, and the dead space of the gate driver 130 may be reduced.

In addition, since the voltage of the third control node NQ3 is bootstrapped and the sixth transistor T6 and accordingly the eighth transistor T8 are sufficiently turned on or turned off, the reliability of the gate driver 130 may be improved.

Also, the bootstrapped voltage of the third control node NQ3 is maintained by the voltage limiting circuit 220, so that the reliability of the gate driver 130 may be improved.

Furthermore, the gate output circuit 250 outputs the second high gate voltage VGH2 and the second low gate voltage VGL2, so that the performance of the gate driver 130 may be improved.

Moreover, since the voltage swing width between the first high gate voltage VGH1 and the first low gate voltage VGL1 received by the carry output circuit 240 is smaller than the voltage swing width between the second high gate voltage VGH2 and the second low gate voltage VGL2 received by the gate output circuit 250, the power consumption of the gate driver 130 may be decreased.

Figure 6:
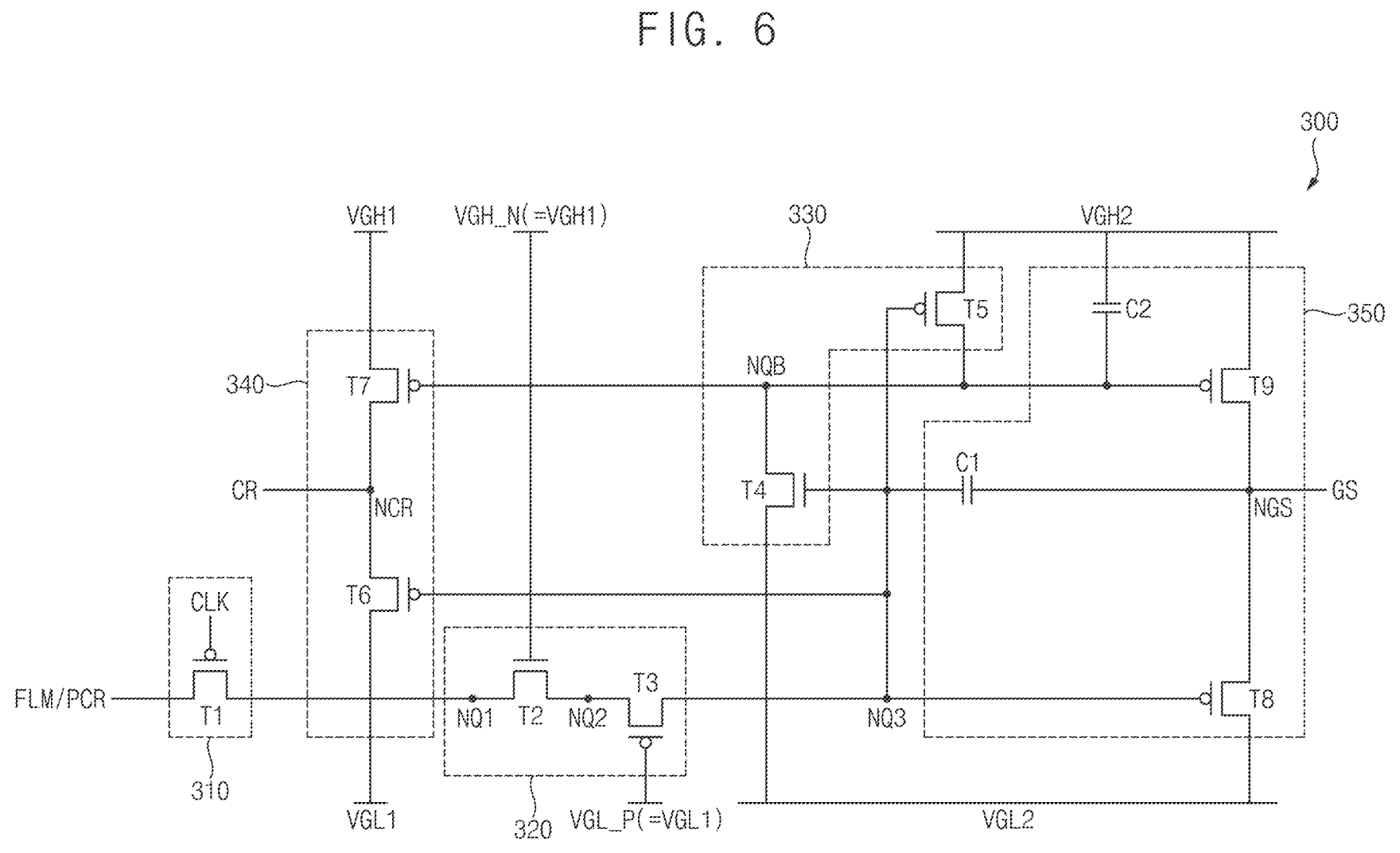

FIG. 6 is a schematic circuit diagram showing an example of the stage 300 included in the gate driver 130 of FIG. 2, according to an embodiment.

The stage 300 of FIG. 6 is substantially the same as the gate driver of FIGS. 1 to 5 and the display device, except for the configuration of the voltage limiting circuit. Thus, the same reference numbers will be used for the same or similar components, and overlapping descriptions will be omitted.

In an embodiment and referring to FIGS. 1 to 6, the gate driver 130 may include a plurality of stages 300, where each stage 300 may include a delay circuit 310, a voltage limiting circuit 320, an inverter circuit 330, a carry output circuit 340, and a gate output circuit 350.

FIG. 6 illustrates an embodiment in which the gate electrode of the second transistor T2 receives the high limit voltage VGH_N which is equal to the first high gate voltage VGH1 and the gate electrode of the third transistor T3 receives the low limit voltage VGL_P which is equal to the first low gate voltage VGL1.

Since the voltage limit circuit 320 limits the voltage flow through which the voltage of the third control node NQ3 is transmitted to the first control node NQ1 based on the high limit voltage VGH_N and the low limit voltage VGL_P, a voltage range in which the voltage of the third control node NQ3 is transmitted to the first control node NQ1 may be changed according to the high limit voltage VGH_N and the low limit voltage VGL_P.

Figure 7:
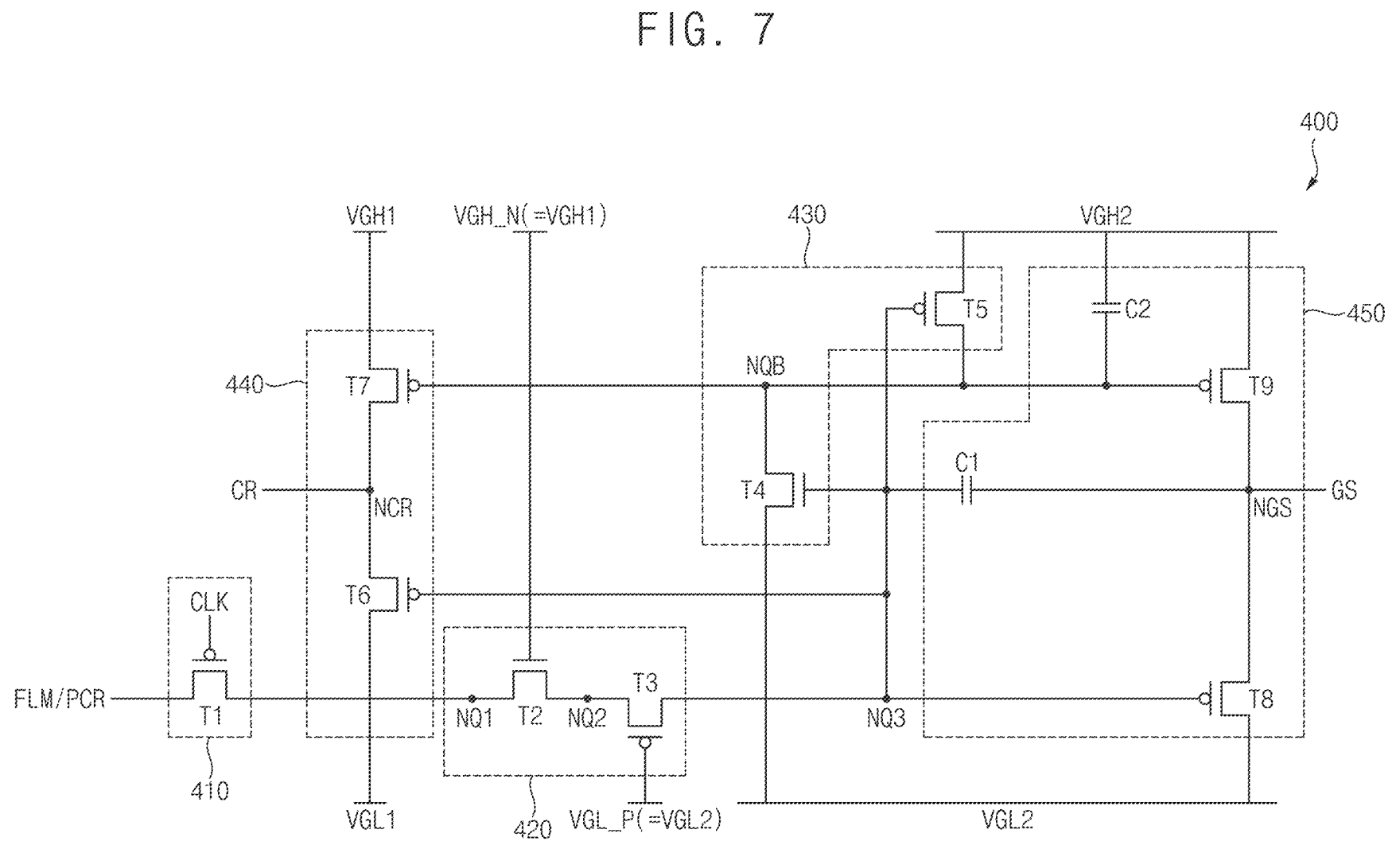

FIG. 7 is a schematic circuit diagram showing an example of the stage 400 included in the gate driver 130 of FIG. 2, according to an embodiment.

The stage 400 of FIG. 7 is substantially the same as the gate driver of FIGS. 1 to 5 and the display device, except for the configuration of the voltage limiting circuit. Thus, the same reference numbers will be used for the same or similar components, and overlapping descriptions will be omitted.

In an embodiment and referring to FIGS. 1 to 5 and FIG. 7, the gate driver 130 may include a plurality of stages 400, where each stage 400 may include a delay circuit 410, a voltage limiting circuit 420, an inverter circuit 430, a carry output circuit 440, and a gate output circuit 450.

FIG. 7 illustrates an embodiment in which the gate electrode of the second transistor T2 receives the high limit voltage VGH_N which is equal to the first high gate voltage VGH1 and the gate electrode of the third transistor T3 receives the low limit voltage VGL_P which is equal to the second low gate voltage VGL2.

Since the voltage limit circuit 420 limits the voltage flow through which the voltage of the third control node NQ3 is transmitted to the first control node NQ1 based on the high limit voltage VGH_N and the low limit voltage VGL_P, a voltage range in which the voltage of the third control node NQ3 is transmitted to the first control node NQ1 may be changed according to the high limit voltage VGH_N and the low limit voltage VGL_P.

Figure 8:
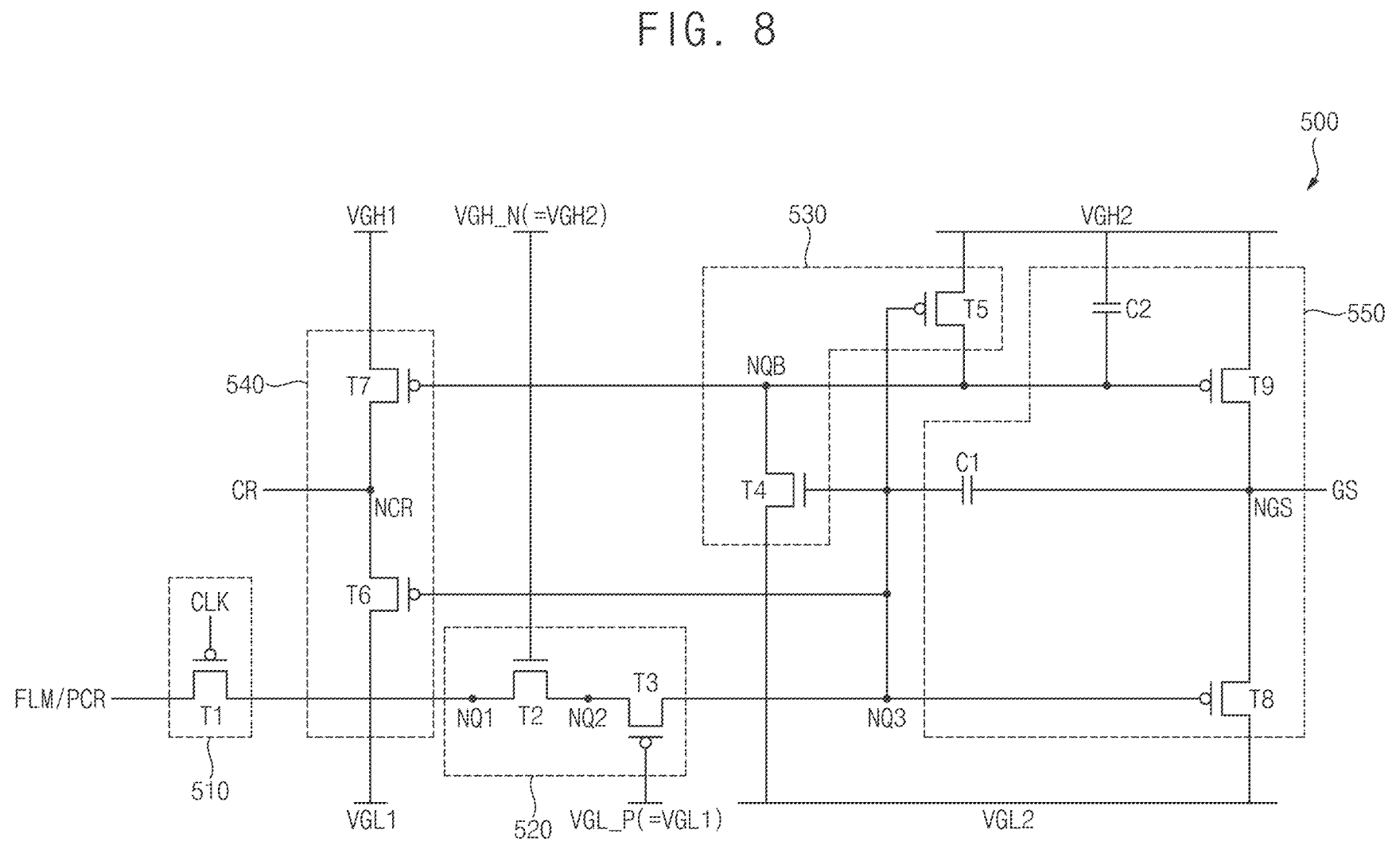

FIG. 8 is a schematic circuit diagram showing an example of the stage 500 included in the gate driver 130 of FIG. 2, according to an embodiment.

The stage 500 of FIG. 8 is substantially the same as the gate driver of FIGS. 1 to 5 and the display device, except for the configuration of the voltage limiting circuit. Thus, the same reference numbers will be used for the same or similar components, and overlapping descriptions will be omitted.

In an embodiment and referring to FIGS. 1 to 5 and FIG. 8, the gate driver 130 may include a plurality of stages 500, where each stage 500 may include a delay circuit 510, a voltage limiting circuit 520, an inverter circuit 530, a carry output circuit 540, and a gate output circuit 550.

FIG. 8 illustrates an embodiment in which the gate electrode of the second transistor T2 receives the high limit voltage VGH_N which is equal to the second high gate voltage VGH2 and the gate electrode of the third transistor T3 receives the low limit voltage VGL_P which is equal to the first low gate voltage VGL1.

Since the voltage limit circuit 520 limits the voltage flow through which the voltage of the third control node NQ3 is transmitted to the first control node NQ1 based on the high limit voltage VGH_N and the low limit voltage VGL_P, a voltage range in which the voltage of the third control node NQ3 is transmitted to the first control node NQ1 may be changed according to the high limit voltage VGH_N and the low limit voltage VGL_P.

Figure 9:
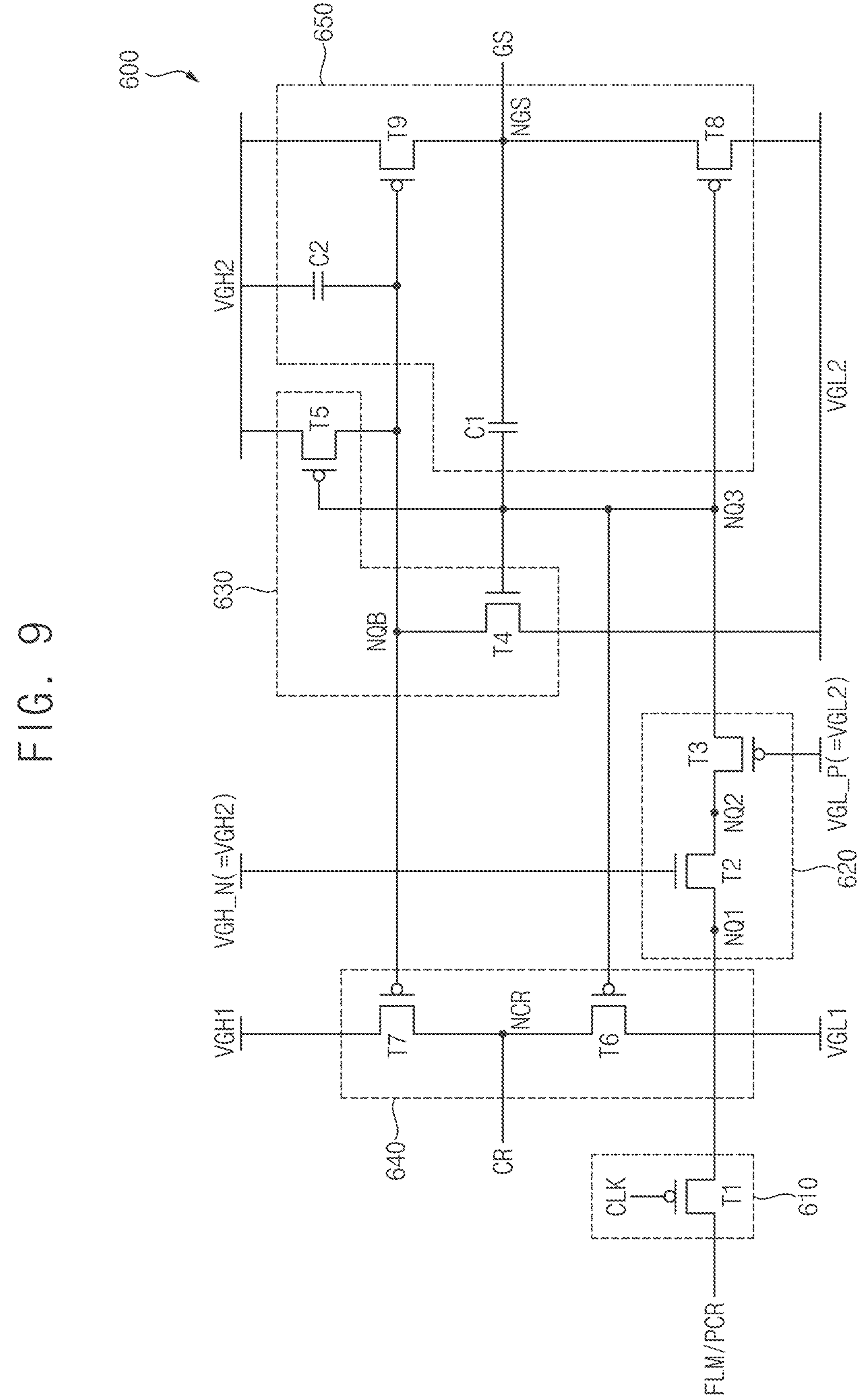
FIG. 9 is a schematic circuit diagram showing another example of the stage included in the gate driver of FIG. 2, according to an embodiment.

FIG. 9 is a schematic circuit diagram showing an example of the stage 600 included in the gate driver 130 of FIG. 2, according to an embodiment.

The stage 600 of FIG. 9 is substantially the same as the gate driver of FIGS. 1 to 5 and the display device, except for the configuration of the voltage limiting circuit. Thus, the same reference numbers will be used for the same or similar components, and overlapping descriptions will be omitted.

In an embodiment and referring to FIGS. 1 to 5 and FIG. 9, the gate driver 130 may include a plurality of stages 600, where each stage 600 may include a delay circuit 610, a voltage limiting circuit 620, an inverter circuit 630, a carry output circuit 640, and a gate output circuit 650.

FIG. 9 illustrates an embodiment in which the gate electrode of the second transistor T2 receives the high limit voltage VGH_N which is equal to the second high gate voltage VGH2 and the gate electrode of the third transistor T3 receives the low limit voltage VGL_P which is equal to the second low gate voltage VGL2.

Since the voltage limit circuit 620 limits the voltage flow through which the voltage of the third control node NQ3 is transmitted to the first control node NQ1 based on the high limit voltage VGH_N and the low limit voltage VGL_P, a voltage range in which the voltage of the third control node NQ3 is transmitted to the first control node NQ1 may be changed according to the high limit voltage VGH_N and the low limit voltage VGL_P.

Figure 10:
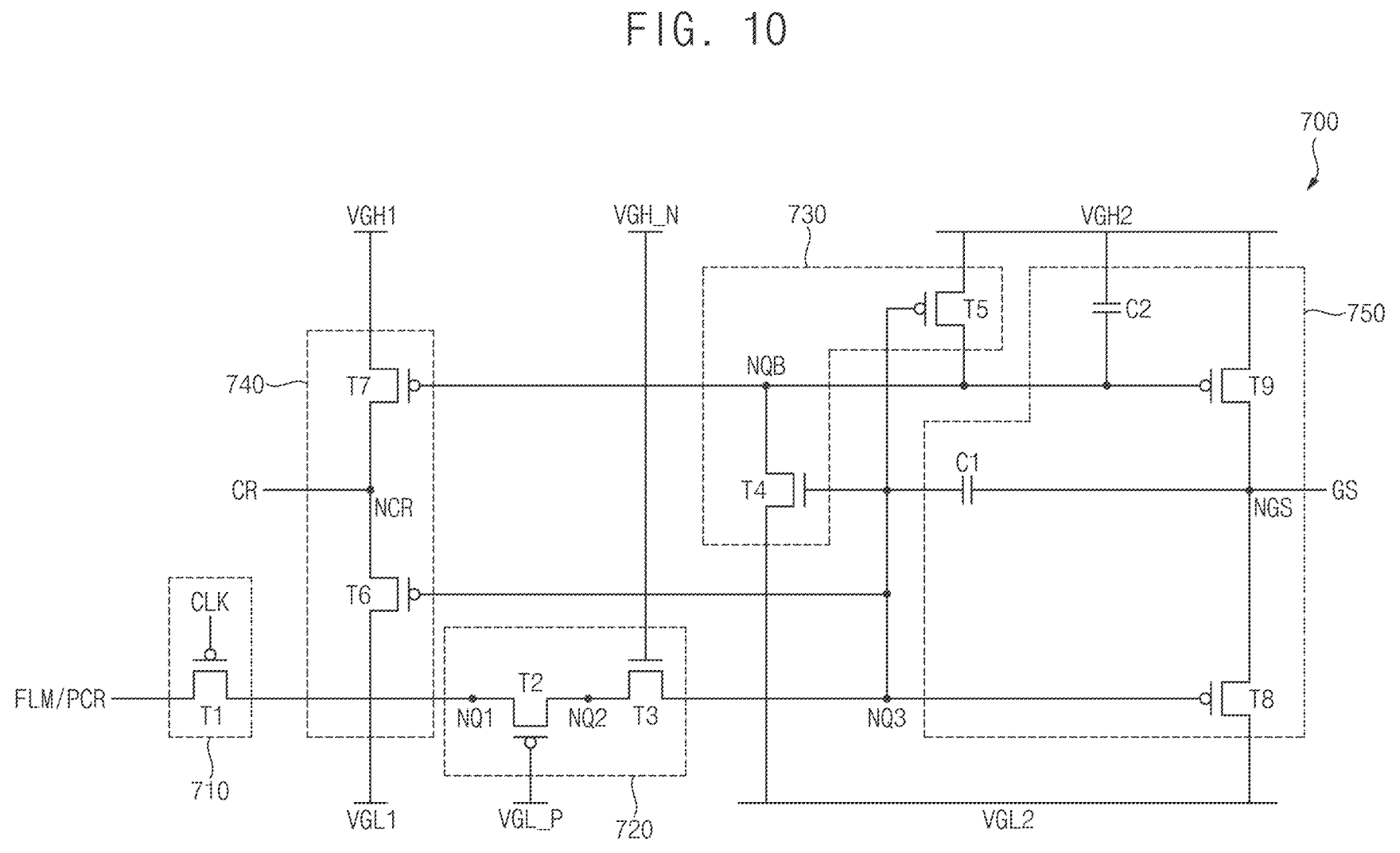

FIG. 10 is a schematic circuit diagram showing an example of the stage 700 included in the gate driver 130 of FIG. 2, according to an embodiment.

The stage 700 of FIG. 10 is substantially the same as the gate driver of FIGS. 1 to 5 and the display device, except for the configuration of the voltage limiting circuit. Thus, the same reference numbers will be used for the same or similar components, and overlapping descriptions will be omitted.

In an embodiment and referring to FIGS. 1 to 5 and FIG. 10, the voltage limiting circuit 720 may include a second transistor T2 and a third transistor T3. The second transistor T2 may include a gate electrode for receiving the low limit voltage VGL_P, a first electrode connected to the first control node NQ1, and a second electrode connected to the second control node NQ2. The third transistor T3 may include a gate electrode for receiving the high limit voltage VGH_N, a first electrode connected to the second control node NQ2, and a second electrode connected to the third control node NQ3. In an embodiment, the second transistor T2 may be a PMOS transistor, and the third transistor T3 may be an NMOS transistor.

Figure 11:
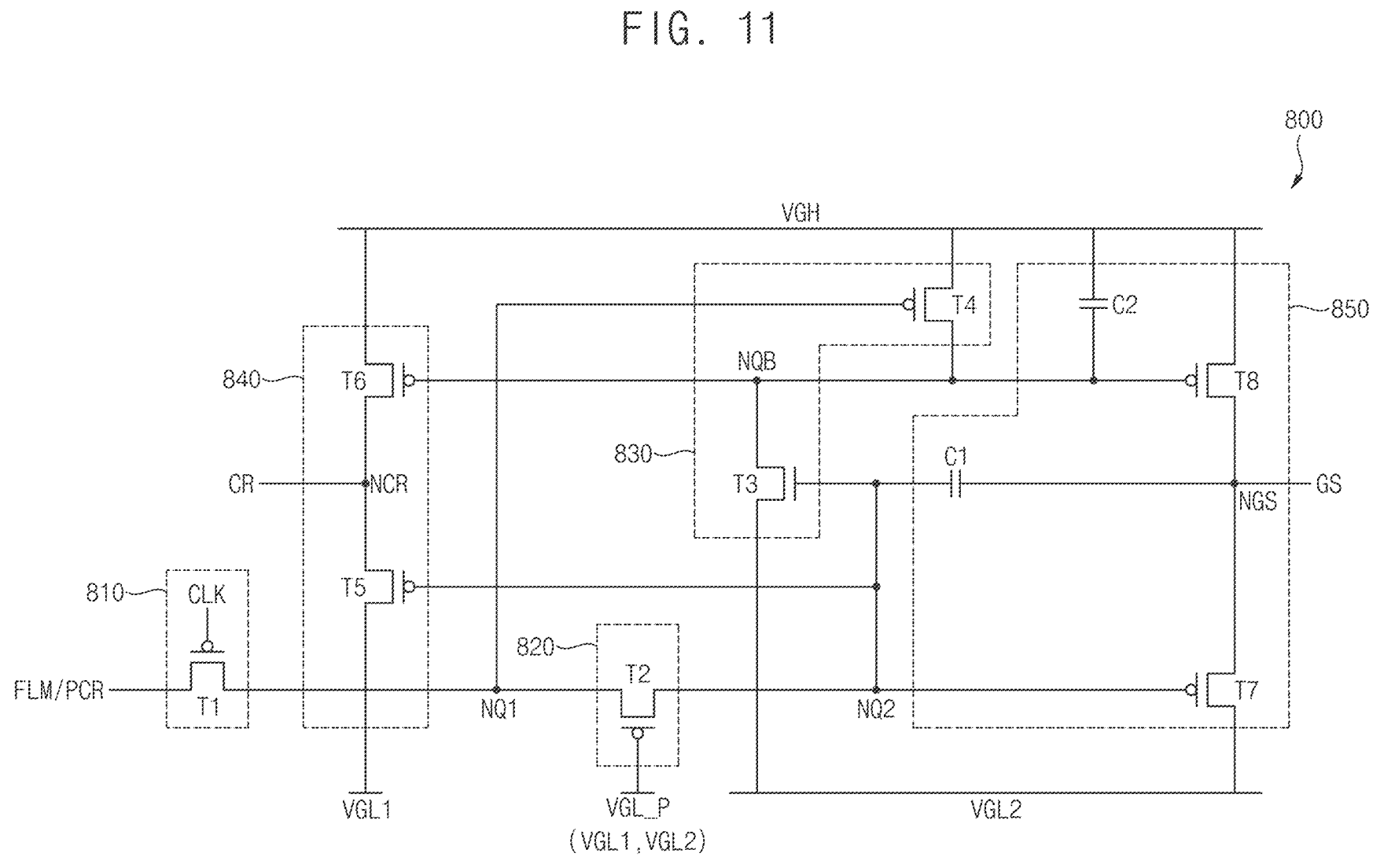

FIG. 11 is a schematic circuit diagram showing an example of the stage 800 included in the gate driver 130 of FIG. 2, according to an embodiment.

In an embodiment and referring to FIGS. 1, 2 and 11, the gate driver 130 may include a plurality of stages 800. Each stage 800 may include a delay circuit 810, a voltage limiting circuit 820, an inverter circuit 830, a carry output circuit 840, and a gate output circuit 850.

The delay circuit 810 may receive an input signal FLM/PCR in response to the clock signal CLK and output the input signal FLM/PCR to control nodes NQ1 and NQ2. The control nodes NQ1 and NQ2 may include a first control node NQ1 and a second control node NQ2.

In an embodiment, the delay circuit 810 may include a first transistor T1. The first transistor T1 may include a gate electrode for receiving the clock signal CLK, a first electrode for receiving the input signal FLM/PCR, and a second electrode connected to the first control nodes NQ1. The first transistor T1 may be a PMOS transistor.

The voltage limiting circuit 820 may limit voltages of the control nodes NQ1 and NQ2 based on a low limit voltage VGL_P.

In an embodiment, the voltage limiting circuit 820 may include a second transistor T2. The second transistor T2 may include a gate electrode for receiving the low limit voltage VGL_P, a first electrode connected to the first control node NQ1, and a second electrode connected to the second control node NQ2. The second transistor T2 may be a PMOS transistor. The low limit voltage VGL_P may be a first low gate voltage VGL1 or a second low gate voltage VGL2. The second low gate voltage VGL2 may be lower than the first low gate voltage VGL1.

The inverter circuit 830 may invert the voltages of the control nodes NQ1 and NQ2 to output the inverted voltages to an inverting control node NQB.

In an embodiment, the inverter circuit 830 may include a third transistor T3 and a fourth transistor T4. The third transistor T3 may include a gate electrode connected to the second control node NQ2, a first electrode for receiving a second low gate voltage VGL2, and a second electrode connected to the inverting control node NQB. The fourth transistor T4 may include a gate electrode connected to the first control node NQ1, a first electrode for receiving a high gate voltage VGH, and a second electrode connected to the inverting control node NQB. The third transistor T3 may be an NMOS transistor, and the fourth transistor T4 may be the PMOS transistor.

In an embodiment, the carry output circuit 840 may output a carry signal CR. The carry output circuit 840 may output the first low gate voltage VGL1 to a carry output node NCR in response to the voltage of the second control node NQ2, and may output the high gate voltage VGH to the carry output node NCR in response to a voltage of the inverting control node NQB.

In an embodiment, the carry output circuit 840 may include a fifth transistor T5 and a sixth transistor T6. The fifth transistor T5 may include a gate electrode connected to the second control node NQ2, a first electrode for receiving the first low gate voltage VGL1, and a second electrode connected to the carry output node NCR. The sixth transistor T6 may include a gate electrode connected to the inverting control node NQB, a first electrode for receiving the high gate voltage VGH, and a second electrode connected to the carry output node NCR. The fifth transistor T5 and the sixth transistor T6 may be the PMOS transistor. In an embodiment, the gate output circuit 850 may output a gate signal GS. The gate output circuit 850 may output the second low gate voltage VGL2 lower than the first low gate voltage VGL1 to a gate output node NGS in response to the voltages of the second control node NQ2, and may output the high gate voltage VGH to the gate output node NGS in response to the voltage of the inverting control node NQB.

In an embodiment, the gate output circuit 850 may include a seventh transistor T7 and an eighth transistor T8. The seventh transistor T7 may include a gate electrode connected to the second control node NQ2, a first electrode for receiving the second low gate voltage VGL2, and a second electrode connected to the gate output node NGS. The eighth transistor T8 may include a gate electrode connected to the inverting control node NQB, a first electrode for receiving the high gate voltage VGH, and a second electrode connected to the gate output node NGS. The seventh transistor T7 and the eighth transistor T8 may be the PMOS transistor.

In an embodiment, the gate output circuit 850 may further include a first capacitor C1 and a second capacitor C2. The first capacitor C1 may include a first electrode connected to the second control node NQ2 and a second electrode connected to the gate output node NGS. The second capacitor C2 may include a first electrode for receiving the high gate voltage VGH and a second electrode connected to the inverting control node NQB.

In an embodiment, since the fifth transistor T5 of the carry output circuit 840 and the seventh transistor T7 of the gate output circuit 250 are the PMOS transistors other than the NMOS transistors, a negative shift in threshold voltages of the fifth transistor T5 and the seventh transistor T7 may be prevented, and a dead space of the gate driver 130, which is increased by enlarging the sizes of the fifth transistor T5 and the seventh transistor T7 to compensate for mobility of the fifth transistor T5 and the seventh transistor T7, may be prevented from being increased.

Since each stage 800 includes eight transistors and two capacitors, the area occupied by each stage 800 may be decreased and the data space of the gate driver 130 may be decreased.

Figure 12:
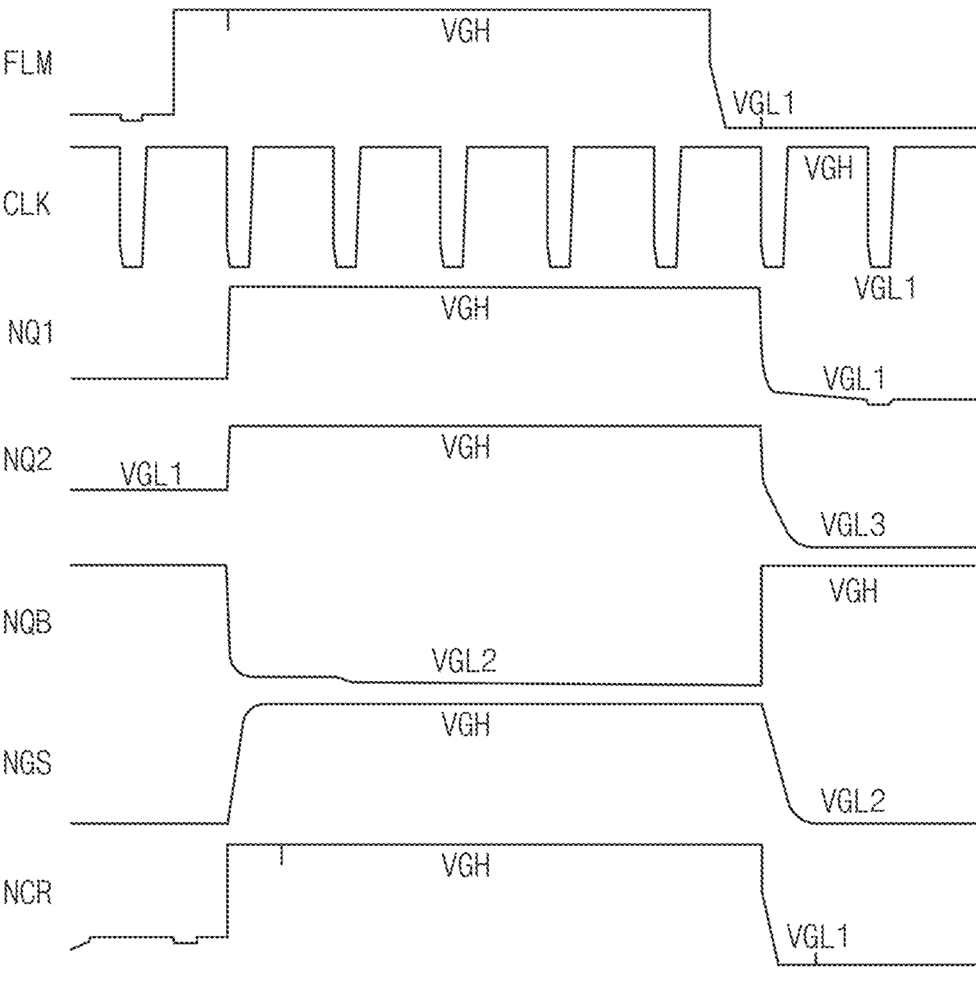
FIG. 12 is a timing diagram showing an example of the operation of the stage of FIG. 11, according to an embodiment.
Figure 13:
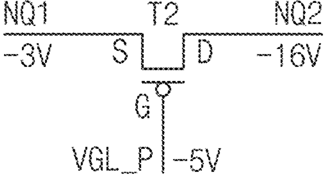
FIG. 13 is a schematic circuit diagram showing an example of the operation of the voltage limiting circuit included in the stage of FIG. 11, according to an embodiment.

FIG. 12 is a timing diagram showing an example of the operation of the stage 800 of FIG. 11, according to an embodiment. FIG. 13 is a circuit diagram showing an example of the operation of the voltage limiting circuit 820 included in the stage 800 of FIG. 11, according to an embodiment.

In an embodiment and referring to FIGS. 1 to 2 and FIGS. 11 to 13, the delay circuit 810 may receive the input signal FLM/PCR in response to the clock signal CLK and may output the input signal FLM/PCR to the control nodes NQ1 and NQ2. Specifically, the first transistor T1 may receive the input signal FLM/PCR in response to the clock signal CLK having the first low gate voltage VGL1 and may output the input signal FLM/PCR to the first control node NQ1. Therefore, the input signal FLM/PCR may be delayed by one horizontal period by the delay circuit 210 and output to the first control node NQ1.

In an embodiment, when the clock signal CLK has the first low gate voltage VGL1, the first transistor T1 may receive the input signal FLM/PCR having the high gate voltage VGH in response to the clock signal CLK having the first low gate voltage VGL1, and may output the input signal FLM/PCR having the high gate voltage VGH to the first control node NQ1. The first control node NQ1 may have the high gate voltage VGH.

In an embodiment, the voltage limiting circuit 820 may output the voltage of the first control node NQ1 to the second control node NQ2. Specifically, the second transistor T2 may output the voltage of the first control node NQ1 to the second control node NQ2. The second control node NQ2 may have the high gate voltage VGH.

In an embodiment, the inverter circuit 230 may invert the voltages of the control nodes NQ1 and NQ2 and may output the inverted voltages to the inverting control node NQB. Specifically, when the second control node NQ2 has a high level, the fourth transistor T3 may output the second low gate voltage VGL2 to the inverting control node NQB in response to the second control node NQ2 having the high level. In addition, when the first control node NQ1 has a low level, the fourth transistor T4 may output the high gate voltage VGH to the inverting control node NQB in response to the first control node NQ1 having the low level. Therefore, the inverting control node NQB may have a phase inverted with the voltage of the control node NQ1 and NQ2 by the inverter circuit 230.

In an embodiment, when the second control node NQ2 has the high gate voltage VGH, the third transistor T3 may output the second low gate voltage VGL2 to the inverting control node NQB in response to the second control node NQ2 having the high gate voltage VGH. The inverting control node NQB may have the second low gate voltage VGL2.

In an embodiment, the carry output circuit 840 may output a carry signal CR. The carry output circuit 840 may output a first low gate voltage VGL1 to the carry output node NCR in response to the voltages of the second control node NQ2, and may output a high gate voltage VGH to the carry output node NCR in response to a voltage of the inverting control node NQB. Specifically, when the inverting control node NQB has the low level, the sixth transistor T6 may output the high gate voltage VGH to the carry output node NCR in response to the inverting control node NQB having the low level. In addition, when the second control node NQ2 has the low level, the fifth transistor T5 may output the first low gate voltage VGL1 to the carry output node NCR in response to the second control node NQ2 having the low level.

In an embodiment, when the inverting control node NQB has the second low gate voltage VGL2, the sixth transistor T6 may output the high gate voltage VGH to the carry output node NCR in response to the inverting control node NQB having the second low gate voltage VGL2. The carry output node NCR may have the high gate voltage VGH.

In an embodiment, the gate output circuit 850 may output a gate signal GS, where the gate output circuit 850 may output the second low gate voltage VGL2 to the gate output node NGS in response to the voltage of the second control node NQ2, and may output the high gate voltage VGH to the gate output node NGS in response to the voltage of the inverting control node NQB. Specifically, when the inverting control node NQB has the low level, the eighth transistor T8 may output the high gate voltage VGH to the gate output node NGS in response to the inverting control node NQB having the low level. In addition, when the second control node NQ2 has the low level, the seventh transistor T7 may output the second low gate voltage VGL2 to the gate output node NGS in response to the second control node NQ2 having the low level.

In an embodiment, when the inverting control node NQB has the second low gate voltage VGL2, the eighth transistor T8 may output the high gate voltage VGH to the gate output node NGS in response to the inverting control node NQB having the second low gate voltage VGL2. The gate output node NGS may have the high gate voltage VGH.

In an embodiment, when the voltage of the gate output node NGS is changed, the voltage of the second control node NQ2 may be bootstrapped while the stored voltage is maintained between the two electrodes of the first capacitor C1. When the voltage of the gate output node NGS is decreased from the high gate voltage VGH to the second low gate voltage VGL2, the voltage of the second control node NQ2 may be bootstrapped to a third low gate voltage VGL3 which is lower than the second low gate voltage VGL2.

In an embodiment, since the bootstrapped voltage of the second control node NQ2 is the voltage lower than the second low gate voltage VGL2, the fifth transistor T5 and the seventh transistor T7 may be sufficiently turned on, and the reliability of operations of the fifth transistor T5 and the seventh transistor T7 may be improved.

In an embodiment, the voltage limiting circuit 820 may limit the voltages of the control nodes NQ1 and NQ2 based on the low limit voltage VGL_P. Specifically, the voltage limiting circuit 220 may limit a voltage flow through which the bootstrapped voltage of the second control node NQ2 is transmitted to the first control node NQ1, and the bootstrapped voltage of the second control node NQ2 may be maintained. The reliability of the operations of the fifth transistor T5 and the seventh transistor T7 may be further improved.

In an embodiment and as shown in FIG. 13, a threshold voltage of the second transistor T2 may be −2V, and the low limit voltage VGL_P may be −5V. However, the voltages shown in FIG. 13 are set to describe the operation of the voltage limiting circuit 820 and are not directly related to each stage 800 of FIGS. 11 and 12.

The embodiment shown in FIG. 13 denotes a case in which the bootstrapped voltage of the second control node NQ2 is the low level. When the voltage of the first control node NQ1 is −3V and the bootstrapped voltage of the third control node NQ3 is 16V, a gate-source voltage of the second transistor T2 may be −2V. Since a gate-source voltage of the second transistor T2 is not lower than the threshold voltage of the second transistor T2, the second transistor T2 may be turned off, and may not transmit the bootstrapped voltage of the second control node NQ2 to the first control node NQ1. Therefore, the bootstrapped voltage of the second control node NQ32 may be maintained at −16V. The reliability of the operations of the fifth transistor T5 and the seventh transistor T7 may be further improved.

In an embodiment, since the gate output circuit 850 outputs the high gate voltage VGH and the second low gate voltage VGL2, the performance of the gate driver 130 may be improved. In addition, since a voltage swing width between the high gate voltage VGH and the first low gate voltage VGL1 received by the carry output circuit 840 is smaller than a voltage swing width between the high gate voltage VGH and the second low gate voltage VGL2 received by the gate output circuit 850, the power consumption of the gate driver 130 may be decreased. Since the voltage swing width between the high gate voltage VGH and the first low gate voltage VGL1 of the input signal FLM/PCR is smaller than the voltage swing width between the high gate voltage VGH and the second low gate voltage VGL2 received by the gate output circuit 850, the power consumption of the gate driver 130 may be decreased.

Accordingly, the carry output circuit 840 and the gate output circuit 850 are formed of the PMOS transistor having high reliability and high mobility, so that the reliability of the gate driver 130 may be improved, and the dead space of the gate driver 130 may be reduced. Also, since the voltage of the third control node NQ3 is bootstrapped and the fifth transistor T5 and accordingly the seventh transistor T7 are sufficiently turned on or turned off, the reliability of the gate driver 130 may be improved.

Additionally, the bootstrapped voltage of the second control node NQ2 is maintained by the voltage limiting circuit 820, so that the reliability of the gate driver 130 may be improved.

Furthermore, the gate output circuit 850 outputs the high gate voltage VGH and the second low gate voltage VGL2, so that the performance of the gate driver 130 may be improved.

Moreover, since the voltage swing width between the high gate voltage VGH and the first low gate voltage VGL1 received by the carry output circuit 840 is smaller than the voltage swing width between the high gate voltage VGH and the second low gate voltage VGL2 received by the gate output circuit 850, the power consumption of the gate driver 130 may be decreased.

Figure 14:
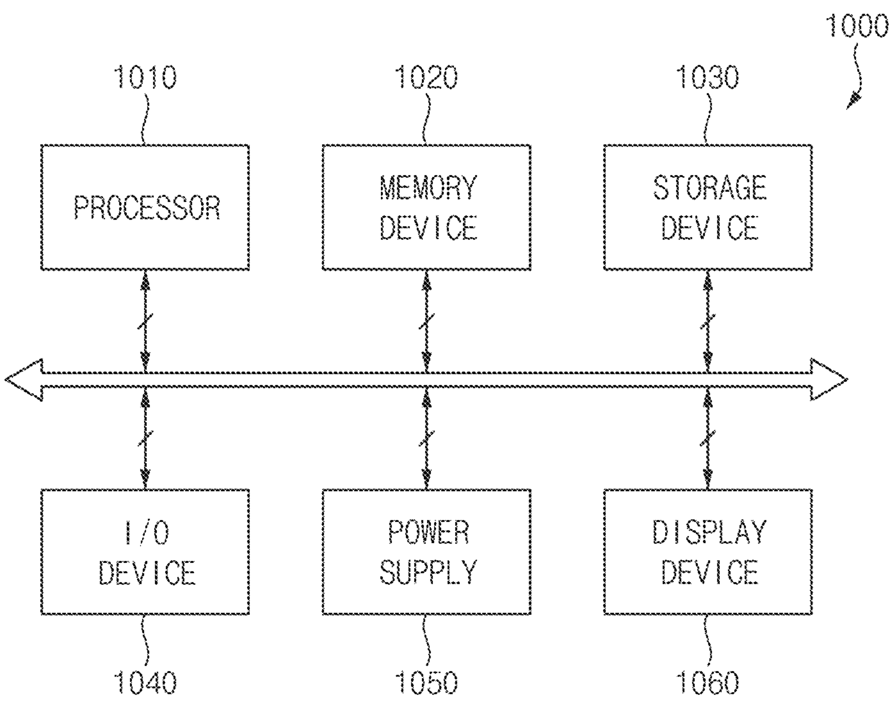
FIG. 14 is a block diagram illustrating an electronic device, according to an embodiment.
Figure 15:
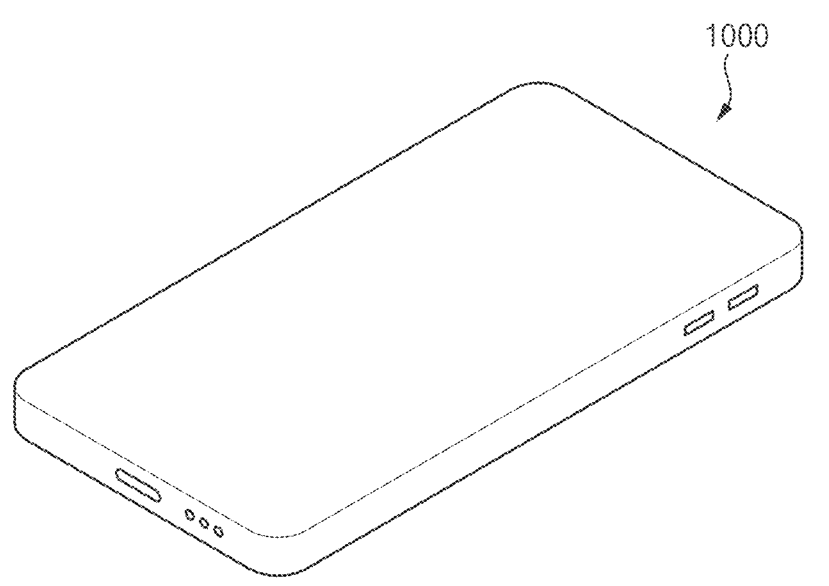
FIG. 15 is a diagram illustrating an embodiment in which the electronic device of FIG. 14 is implemented as a smart phone.

FIG. 14 is a block diagram illustrating an electronic device 1000, according to an embodiment. FIG. 15 is a diagram illustrating an embodiment in which the electronic device 1000 of FIG. 14 is implemented as a smart phone.

In an embodiment and referring to FIGS. 14 and 15, the electronic device 1000 may include a processor 1010, a memory device 1020, a storage device 1030, an input/output (I/O) device 1040, a power supply 1050, and a display device 1060, where the display device 1060 may be the display device 10 of FIG. 1. In addition, the electronic device 1000 may further include a plurality of ports for communicating with a video card, a sound card, a memory card, a universal serial bus (USB) device, other electronic devices, and the like.

In an embodiment, as illustrated in FIG. 15, the electronic device 1000 may be implemented as a smart phone. However, the electronic device 1000 is not limited thereto. For example, in other embodiments, the electronic device 1000 may be implemented as a cellular phone, a video phone, a smart pad, a smart watch, a tablet PC, a car navigation system, a computer monitor, a laptop, a head mounted display (HMD) device, and the like.

In an embodiment, the processor 1010 may perform various computing functions. The processor 1010 may be a micro-processor, a central processing unit (CPU), an application processor (AP), and the like. The processor 1010 may be coupled to other components via an address bus, a control bus, a data bus, and the like. Further, the processor 1010 may be coupled to an extended bus such as a peripheral component interconnection (PCI) bus.

In an embodiment, the memory device 1020 may store data for operations of the electronic device 1000. For example, the memory device 1020 may include at least one non-volatile memory device such as an erasable programmable read-only memory (EPROM) device, an electrically erasable programmable read-only memory (EEPROM) device, a flash memory device, a phase change random access memory (PRAM) device, a resistance random access memory (RRAM) device, a nano floating gate memory (NFGM) device, a polymer random access memory (PoRAM) device, a magnetic random access memory (MRAM) device, a ferroelectric random access memory (FRAM) device, and the like and/or at least one volatile memory device such as a dynamic random access memory (DRAM) device, a static random access memory (SRAM) device, a mobile DRAM device, and the like.

In an embodiment, the storage device 1030 may include a solid-state drive (SSD) device, a hard disk drive (HDD) device, a CD-ROM device, and the like.

In an embodiment, the I/O device 1040 may include an input device such as a keyboard, a keypad, a mouse device, a touch-pad, a touch-screen, and the like, and an output device such as a printer, a speaker, and the like. In some embodiments, the I/O device 1040 may include the display device 1060.

The power supply 1050 may provide power for operations of the electronic device 1000.

The display device 1060 may be connected to other components through buses or other communication links.

The invention may be applied to any display device and any electronic device including the touch panel. For example, the invention may be applied to a mobile phone, a smart phone, a tablet computer, a digital television (TV), a 3D TV, a personal computer (PC), a home appliance, a laptop computer, a personal digital assistant (PDA), a portable multimedia player (PMP), a digital camera, a music player, a portable game console, a navigation device, etc.

The foregoing is illustrative of the invention and is not to be construed as limiting thereof. Although a few embodiments of the invention have been described, those skilled in the art will readily appreciate that many modifications are possible in the invention without materially departing from the novel teachings and advantages of the invention. Accordingly, all such modifications are intended to be included within the scope of the invention. Therefore, it is to be understood that the foregoing is illustrative of the invention and is not to be construed as limited to the specific embodiments disclosed, and that modifications to the disclosed embodiments, as well as other embodiments, are intended to be included within the scope of the invention. Moreover, the embodiments or parts of the embodiments may be combined in whole or in part without departing from the scope of the invention.

What is claimed is:

1. A gate driver including a plurality of stages, wherein each of the plurality of stages comprises:

a delay circuit configured to receive an input signal in response to a clock signal and to output the input signal to a control node of a plurality of control nodes, wherein the delay circuit includes a first transistor;

a voltage limiting circuit configured to limit a voltage of the control node based on a high limit voltage and a low limit voltage, wherein the voltage limiting circuit includes a second transistor and a third transistor;

an inverter circuit configured to invert the voltage of the control node and to output an inverted voltage to an inverting control, wherein the inverter circuit includes a fourth transistor and a fifth transistor;

a carry output circuit configured to output a first low gate voltage to a carry output node in response to the voltage of the control node, and to output a first high gate voltage to the carry output node in response to a voltage of the inverting control node, wherein the carry output circuit includes a sixth transistor and a seventh transistor; and a gate output circuit configured to output a second low gate voltage which is lower than the first low gate voltage to a gate output node in response to the voltage of the control node, and to output a second high gate voltage which is higher than the first high gate voltage to the gate output node in response to the voltage of the inverting control node, wherein the gate output circuit includes an eighth transistor and a ninth transistor, and wherein the gate output circuit includes: the eighth transistor including a gate electrode connected to the control node, a first electrode configured to receive the second low gate voltage, and a second electrode connected to the gate output node; the ninth transistor including a gate electrode connected to the inverting control node, a first electrode configured to receive the second high gate voltage, and a second electrode connected to the gate output node;

a first capacitor including a first electrode connected to the control node and a second electrode connected to the gate output node; and a second capacitor including a first electrode configured to receive the second high gate voltage and a second electrode connected to the inverting control node.

2. The gate driver of claim 1, wherein a voltage swing width between the first high gate voltage and the first low gate voltage is smaller than a voltage swing width between the second high gate voltage and the second low gate voltage.

3. The gate driver of claim 1, wherein the delay circuit includes the first transistor including a gate electrode for receiving the clock signal, a first electrode for receiving the input signal, and a second electrode connected to the control node.

4. The gate driver of claim 1, wherein the plurality of control nodes include a first control node, a second control node and a third control node, and the voltage limiting circuit includes:

the second transistor including a gate electrode for receiving the high limit voltage, a first electrode connected to the first control node, and a second electrode connected to the second control node; and the third transistor including a gate electrode for receiving the low limit voltage, a first electrode connected to the second control node, and a second electrode connected to the third control node.

5. The gate driver of claim 4, wherein the second transistor includes an NMOS transistor, and the third transistor includes a PMOS transistor.

6. The gate driver of claim 1, wherein the plurality of control nodes include a first control node, a second control node and a third control node, and the voltage limiting circuit includes:

the second transistor including a gate electrode for receiving the low limit voltage, a first electrode connected to the first control node, and a second electrode connected to the second control node; and the third transistor including a gate electrode for receiving the high limit voltage, a first electrode connected to the second control node, and a second electrode connected to the third control node.

7. The gate driver of claim 6, wherein the second transistor includes a PMOS transistor, and the third transistor includes an NMOS transistor.

8. The gate driver of claim 1, wherein the high limit voltage is different from the first high gate voltage and the second high gate voltage, and the low limit voltage is different from the first low gate voltage and the second low gate voltage.

9. The gate driver of claim 1, wherein the high limit voltage is equal to the first high gate voltage, and the low limit voltage is equal to the first low gate voltage.

10. The gate driver of claim 1, wherein the high limit voltage is equal to the first high gate voltage, and the low limit voltage is equal to the second low gate voltage.

11. The gate driver of claim 1, wherein the high limit voltage is equal to the second high gate voltage, and the low limit voltage is equal to the first low gate voltage.

12. The gate driver of claim 1, wherein the high limit voltage is equal to the second high gate voltage, and the low limit voltage is equal to the second low gate voltage.

13. The gate driver of claim 1, wherein the inverter circuit includes:

the fourth transistor including a gate electrode connected to the control node, a first electrode configured to receive the second low gate voltage, and a second electrode connected to the inverting control node; and the fifth transistor including a gate electrode connected to the control node, a first electrode configured to receive the second high gate voltage, and a second electrode connected to the inverting control node.

14. The gate driver of claim 13, wherein the fourth transistor includes an NMOS transistor, and the fifth transistor includes a PMOS transistor.

15. The gate driver of claim 1, wherein the carry output circuit includes:

the sixth transistor including a gate electrode connected to the control node, a first electrode configured to receive the first low gate voltage, and a second electrode connected to the carry output node; and the seventh transistor including a gate electrode connected to the inverting control node, a first electrode configured to receive the first high gate voltage, and a second electrode connected to the carry output node.

16. A gate driver including a plurality of stages, wherein each of the plurality of stages comprises:

a delay circuit configured to receive an input signal in response to a clock signal and to output the input signal to a control node of a plurality of control nodes, wherein the delay circuit includes a first transistor;

a voltage limiting circuit configured to limit a voltage of the control node based on a low limit voltage, wherein the voltage limiting circuit includes a second transistor;

an inverter circuit configured to invert the voltage of the control node to output the inverted voltage to an inverting control node, wherein the inverter circuit includes a third transistor and a fourth transistor;

a carry output circuit configured to output a first low gate voltage to a carry output node in response to the voltage of the control node, and to output a high gate voltage to the carry output node in response to a voltage of the inverting control node, wherein the carry output circuit includes a fifth transistor and a sixth; and a gate output circuit configured to output a second low gate voltage which is lower than the first low gate voltage to a gate output node in response to the voltage of the control node, and to output the high gate voltage to the gate output node in response to the voltage of the inverting control node, wherein the gate output circuit includes a seventh transistor and a eighth transistor, wherein the plurality of control nodes include a first control node and a second control node, and the voltage limiting circuit includes:

the second transistor including a gate electrode for receiving the low limit voltage, a first electrode connected to the first control node, and a second electrode connected to the second control node, and wherein the inverter circuit includes:

the third transistor including a gate electrode connected to the second control node, a first electrode configured to receive the second low gate voltage, and a second electrode connected to the inverting control node; and the fourth transistor including a gate electrode connected to the first control node, a first electrode configured to receive the high gate voltage, and a second electrode connected to the inverting control node.

17. The gate driver of claim 16, wherein a voltage swing width between the high gate voltage and the first low gate voltage is smaller than a voltage swing width between the high gate voltage and the second low gate voltage.

18. The gate driver of claim 16, wherein the low limit voltage is equal to the first low gate voltage.

19. The gate driver of claim 16, wherein the low limit voltage is equal to the second low gate voltage.

20. The gate driver of claim 16, wherein the second transistor includes a PMOS transistor.

21. A display device comprising:

a display panel including a plurality of pixels; and a gate driver configured to provide a gate signal to the plurality of pixels, wherein the gate driver includes a plurality of stages, where each of the stages includes:

a delay circuit configured to receive an input signal having a voltage swing width between a first high gate voltage and a first low gate voltage in response to a clock signal, and to output the input signal to a control node of a plurality of control nodes, wherein the delay circuit includes a first transistor;

a voltage limiting circuit configured to limit a voltage of the control node based on a high limit voltage and a low limit voltage, wherein the voltage limiting circuit includes a second transistor and a third transistor;

an inverter circuit configured to invert the voltage of the control node and to output the inverted voltage to an inverting control node, wherein the inverter circuit includes a fourth transistor and a fifth transistor;

a carry output circuit configured to output a carry signal to a carry output node in response to the voltage of the control node, wherein the carry output circuit includes a sixth transistor and a seventh transistor; and a gate output circuit configured to output a second low gate voltage which is lower than the first low gate voltage to a gate output node in response to the voltage of the control node, and to output a second high gate voltage which is higher than the first high gate voltage to the gate output node in response to a voltage of the inverting control node, wherein the gate output circuit includes an eighth transistor and a ninth transistor, and wherein the gate output circuit includes: the eighth transistor including a gate electrode connected to the control node, a first electrode configured to receive the second low gate voltage, and a second electrode connected to the gate output node; the ninth transistor including a gate electrode connected to the inverting control node, a first electrode configured to receive the second high gate voltage, and a second electrode connected to the gate output node;

a first capacitor including a first electrode connected to the control node and a second electrode connected to the gate output node; and a second capacitor including a first electrode configured to receive the second high gate voltage and a second electrode connected to the inverting control node.

22. The display device of claim 21, wherein the voltage swing width between the first high gate voltage and the first low gate voltage is smaller than a voltage swing width between the second high gate voltage and the second low gate voltage.

23. The display device of claim 21, wherein the plurality of control nodes include a first control node, a second control node and a third control node, and the voltage limiting circuit includes:

the second transistor including a gate electrode configured to receive the high limit voltage, a first electrode connected to the first control node, and a second electrode connected to the second control node; and the third transistor including a gate electrode configured to receive the low limit voltage, a first electrode connected to the second control node, and a second electrode connected to the third control node.

24. An electronic device comprising:

a display panel including a plurality of pixels;

a gate driver configured to provide a gate signal to the plurality of pixels;

a data driver configured to provide a data voltage to the plurality of pixels;

a driving controller configured to control the gate driver and the data driver; and a processor configured to control the driving controller, wherein the gate driver includes a plurality of stages, where each of the stages includes:

a delay circuit configured to receive an input signal having a voltage swing width between a first high gate voltage and a first low gate voltage in response to a clock signal, and to output the input signal to a control node of a plurality of control nodes, wherein the delay circuit includes a first transistor;

a voltage limiting circuit configured to limit a voltage of the control node based on a high limit voltage and a low limit voltage, wherein the voltage limiting circuit includes a second transistor and a third transistor;

an inverter circuit configured to invert the voltage of the control node and to output the inverted voltage to an inverting control node, wherein the inverter circuit includes a fourth transistor and a fifth transistor;

a carry output circuit configured to output a carry signal to a carry output node in response to the voltage of the control node, wherein the carry output circuit includes a sixth transistor and a seventh transistor; and a gate output circuit configured to output a second low gate voltage which is lower than the first low gate voltage to a gate output node in response to the voltage of the control node, and to output a second high gate voltage which is higher than the first high gate voltage to the gate output node in response to a voltage of the inverting control node, wherein the gate output circuit includes an eighth transistor and a ninth transistor, and wherein the gate output circuit includes: the eighth transistor including a gate electrode connected to the control node, a first electrode configured to receive the second low gate voltage, and a second electrode connected to the gate output node; the ninth transistor including a gate electrode connected to the inverting control node, a first electrode configured to receive the second high gate voltage, and a second electrode connected to the gate output node;

a first capacitor including a first electrode connected to the control node and a second electrode connected to the gate output node; and a second capacitor including a first electrode configured to receive the second high gate voltage and a second electrode connected to the inverting control node.

* * * * *